(12) United States Patent
Baidya et al.

(10) Patent No.: US 11,010,525 B2
(45) Date of Patent: May 18, 2021

(54) FAST PATTERN MATCHING

(71) Applicant: Intel Corporation, Santa Clara, CA (US)

(72) Inventors: Bikram Baidya, Portland, OR (US); John A. Swanson, Forest Grove, OR (US); Prasad N. Atkar, Portland, OR (US); Vivek K. Singh, Portland, OR (US); Aswin Sreedhar, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/457,974

(22) Filed: Jun. 29, 2019

(65) Prior Publication Data
US 2019/0325103 A1 Oct. 24, 2019

(51) Int. Cl.
*G06F 30/33* (2020.01)
*G06F 30/39* (2020.01)

(52) U.S. Cl.
CPC .................................. *G06F 30/39* (2020.01)

(58) Field of Classification Search
CPC .. G06F 30/394; G06F 30/398; G06F 2119/18; G06F 30/30; G06F 30/39; G06F 2119/06; G06F 30/3312; G06F 30/18; G06F 30/367; G06F 16/2462; G06F 16/282; G06F 2203/04111; G06F 2203/04112; G06F 3/04162; G06F 3/0441; G06F 3/0442; G06F 3/0443; G06F 3/0445; G06F 3/0446; G06F 3/0448; G06F 30/392; G06T 2207/30141; G03F 1/36; G03F 1/70; G03F 1/84; G03F 7/705; G03F 1/44; G03F 1/68; G03F 7/70433; G03F 7/70666; G03F 7/70675; H01L 21/027; H01L 22/12; H01L 23/528
USPC ..................................... 716/50–55, 118–125
See application file for complete search history.

(56) References Cited

U.S. PATENT DOCUMENTS

| | | | | |
|---|---|---|---|---|
| 2006/0277520 A1* | 12/2006 | Gennari | ................ | G06T 7/0004 716/53 |
| 2012/0185807 A1* | 7/2012 | Tsai | ...................... | G06F 30/398 716/52 |
| 2015/0143309 A1* | 5/2015 | De Dood | .............. | G06F 30/398 716/107 |

* cited by examiner

*Primary Examiner* — Binh C Tat
(74) *Attorney, Agent, or Firm* — Alliance IP, LLC

(57) ABSTRACT

A search engine receives data describing reference geometry and generates a hash based on the reference geometry. A reference bloom filter is generated for the reference geometry based on the hash. The search engine performs a search to determine whether instances of the reference geometry are present in an integrated circuit (IC) layout. The search includes comparing the reference bloom filter with each one of a plurality of bloom filters corresponding to a plurality of subdomains of the IC layout. Based on results of the comparison, one or more subdomains of interest are identified and searched to determine whether the particular reference geometry is present in the subdomain.

20 Claims, 12 Drawing Sheets

FAST PATTERN MATCHING

TECHNICAL FIELD

This disclosure relates in general to the field of computer systems and, more particularly, to search engines for use in integrated circuit development and testing.

BACKGROUND

In the field of integrated circuit (IC) manufacturing, a process known as photolithography (or simply "lithography") is typically employed in order to form circuitry features onto a substrate, such as a silicon wafer. In the process, an exposure operation is performed whereby selective portions of a photoresist film that is disposed on the wafer surface is exposed to electromagnetic radiation. The type of electromagnetic radiation used will depend upon the sizes of the circuitry features being formed. Typically, the smaller the size of the circuitry features being formed, the shorter the wavelengths of the electromagnetic radiation will be.

A goal in lithography is to maintain uniformity of each instance of an identical structure imaged or "printed" onto the substrate. In some cases, there may be systemic defects in certain structures that arise from a variety of causes such as imperfections in components of the lithography tool, mask defects, among other issues. As lithography techniques may be used not only to write patterns to fabricate semiconductor devices, but also to fabricate masks used therein, such systematic defects may arise in both cases, among other issues.

BRIEF DESCRIPTION OF THE DRAWINGS

Like reference numbers and designations in the various drawings indicate like elements.

DETAILED DESCRIPTION OF EXAMPLE EMBODIMENTS

Figure 1A:
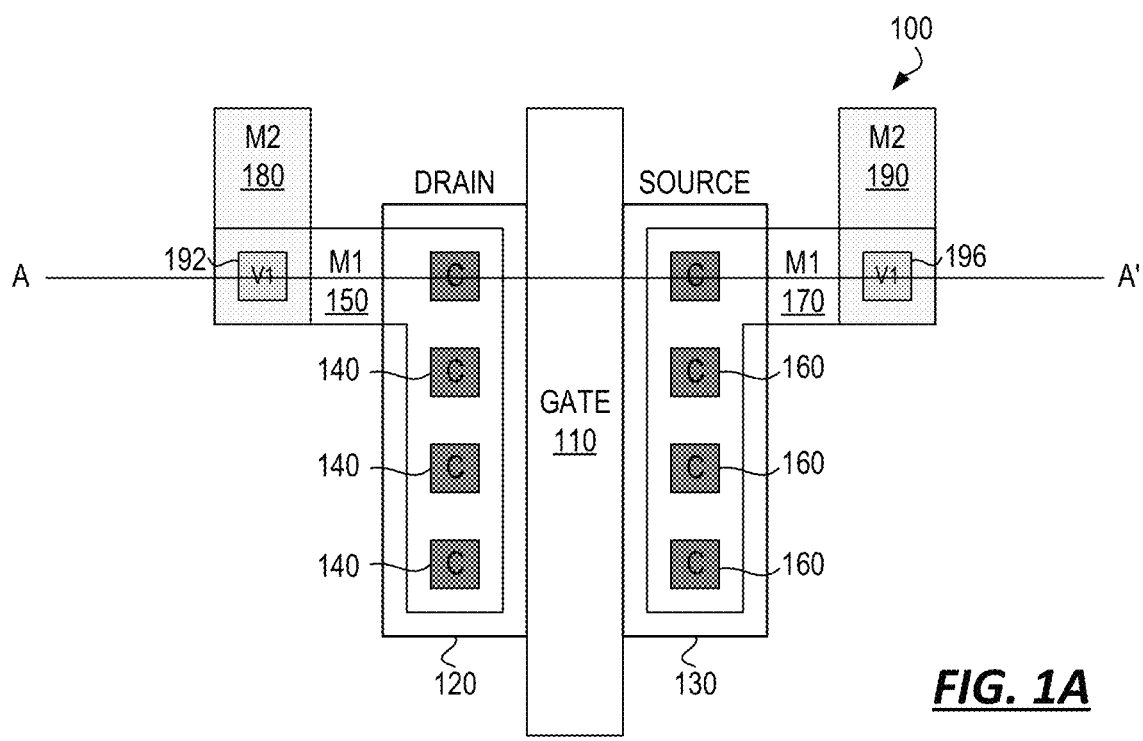
FIG. 1A illustrates the physical design of an exemplary planar transistor.

Semiconductor manufacturing has become increasingly complex over the years. Since the turn of the century, the minimum feature size has shrunk by over an order of magnitude as the industry has progressed from the 130 nm to 10 nm technology nodes. At the same time, processor complexity has dramatically increased. Current flagship products have transistor counts that well exceed 10 billion. To handle these reduced feature sizes and increased chip complexities, companies must invest billions of dollars and years of research to build state-of-the-art fabrication facilities. Research and development costs are driven ever-upward by the rising cost of increasingly sophisticated equipment needed for advanced processes. The industry has taken steps to decrease per-transistor manufacturing costs (for example, by moving from 200 mm to 300 mm wafers at the 90 nm technology node), but the overall trend has been for each process generation to cost more than the last. With up to hundreds of individual dies on wafers that span a foot in diameter, the total number of transistors that can be printed on a wafer is on the order of one trillion. Developing high-volume manufacturing processes that can reliably manufacture transistors at such an extreme scale presents considerable challenges.

One such challenge is discovering the patterns and geometries in a physical design responsible for limiting process yield. Manufacturing defects can be discovered through analysis of SEM (scanning electron microscopy) images generated during wafer manufacturing, but the amount of SEM image data that is to be analyzed to locate defects can be tremendous (up to millions of images). As a process matures, the presence of a manufacturing defect in the mountain of SEM image data that can be generated may be a rare event. Once defects are located, determining whether a particular physical design pattern or geometry is responsible for a class of defects is another difficult task, particularly considering the amount of data that to be analyzed.

The technologies described herein extract semantic patterns from large amounts of silicon data to aid in semiconductor manufacturing process development. Large numbers of SEM images are analyzed for the presence of manufacturing defects in areas of interest on a wafer. A continuous itemset is generated with items containing the values of physical design features corresponding to the areas of interest and an event value indicating the presence or absence of a manufacturing defect at that location. Entropy-based discretization is performed on the discretized itemset to generate a set of candidate semantic patterns. As used herein, the phrase "semantic pattern" refers to one of more sentences or phrases describing constraints on one or more physical design feature values. A semantic pattern can describe a single value for a feature, "gate length=20 nm," a range of values for a feature, "gate endcap space 18 nm," and constraints for multiple features, "gate length=20 nm, gate endcap space 18 nm."

The set of candidate semantic features is reduced to a set of final semantic features that are ranked and presented to a user, such as a process engineer. The semantic features can be ranked based on their accuracy, coverage, interpretability, and independence. Generally, top-ranked semantic patterns are generally those that do a good job of explaining manufacturing defects (the patterns are accurate and provide good defect coverage, as will be discussed in greater detail below) and are simple for a user to understand. The user can use extracted semantic patterns to improve a process by updating the design rule set for a process, improving an optical proximity correction (OPC) recipe, or in other manners.

Reference is now made to the drawings, wherein similar or same numbers may be used to designate same or similar parts in different figures. The use of similar or same numbers in different figures does not mean all figures including similar or same numbers constitute a single or same embodiment.

Turning now to FIGS. 1-3, an overview of various aspects of semiconductor device manufacturing is presented. FIG. 1A illustrates the physical design of an exemplary planar transistor. As will be discussed in greater detail below, the physical design of a transistor is used to generate the masks that will be used during manufacturing to print the features on a wafer needed to implement a particular design. The physical design is typically a set of polygons drawn at various layers, such as a gate layer, contact layer, and metal-1 layer.

Transistor 100 is a field-effect-transistor (FET), the transistor type that comprises the bulk of transistors used in modern semiconductor devices. Transistor 100 comprises gate 110, drain 120, and source 130 regions. The gate region in a FET can be thought of as an "on-off" switch that controls the flow of current between drain and source regions. When gate 110 is "off", there is no (or little) current flowing through a channel region that connects drain 120 to source 130 and when gate 110 is "on", current readily flows through the channel region. Transistor 100 is connected to other transistors by a set of interconnect layers stacked vertically on top of transistor 100. Contacts 140 connect drain 120 to segment 150 of a first metal layer (M1), and contacts 160 connect source 130 to M1 segment 170. M1 segments 150 and 170 are in turn connected to a second metal layer (M2) segments 180 and 190 by a first layer of "vias" (V1) 192 and 196, respectively. In general, metal layer thickness increases as one moves up the interconnect stack, with thinner lower-level metals being generally used for the local routing of signals and thicker upper-level metals being used for global signal routing and power/ground planes. For simplicity, FIG. 1A shows only two levels of metal. Current semiconductor manufacturing processing have up to ten layers of metal interconnects.

Figure 1B:
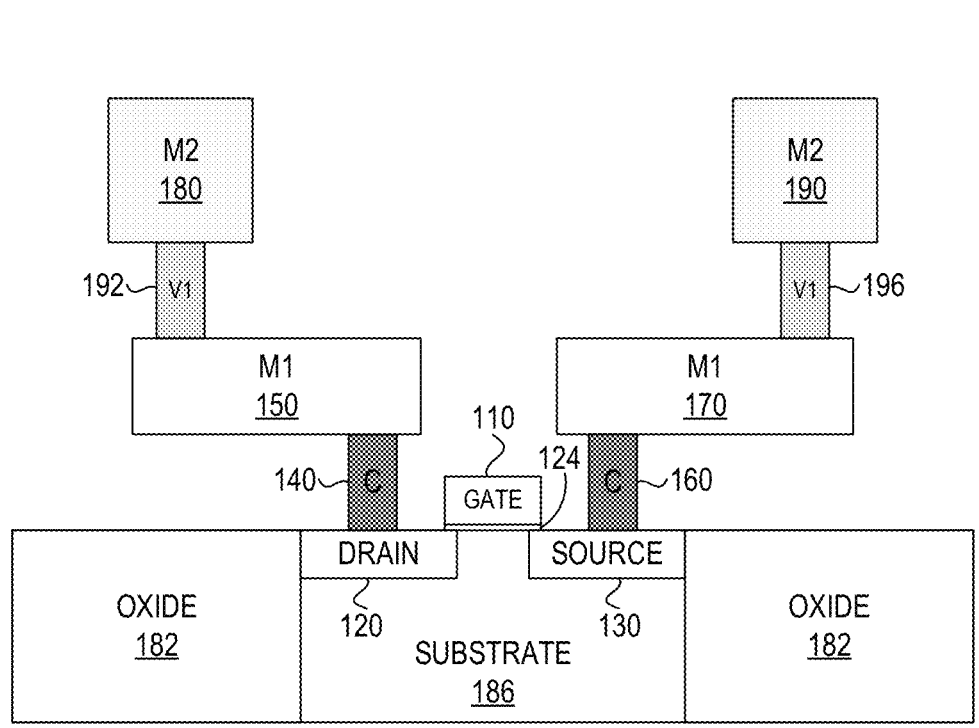
FIG. 1B illustrates an exemplary cross-section of the planar transistor of FIG. 1A taken along the line A-A'.

FIG. 1B illustrates an exemplary cross-section of the planar transistor of FIG. 1A taken along the line A-A'. Cross-section 105 shows gate 110 separated from drain 120 and source 130 regions by high-k dielectric layer 124, which electrically insulates gate 110 from drain 120 and source 130. Transistor 100 is in substrate region 186 and is insulated from adjacent transistors by oxide regions 182. The planar transistor illustrated in FIGS. 1A and 1B is just one type of transistor topography, the planar nature of the transistor reflecting that the gate, source, and drain regions are located on or are adjacent to a relatively planar surface. Another type of transistor topography is the non-planar transistor topography used in FinFETS, which are used extensively in cutting-edge manufacturing processes. FinFETS are field-effect transistors that operate under the same general principle as planar FET transistors—a gate controls the flow of current between drain and source region—with the variation that the gate wraps around a set of fins that extend vertically upwards from the wafer surface.

Essential to semiconductor manufacturing is the process of photolithography, by which patterns are transferred from a mask onto a wafer. As previously mentioned, masks are used to define the shape and location of various features to be patterned on a wafer for a given process layer. For example, one mask defines where oxide regions are located, another mask defines where high-k dielectrics will be located, another mask defines location of source and drain regions, and yet another mask will define where contacts will be placed. Additional masks are used to define each metal layer and intervening via layers.

Figure 2A:
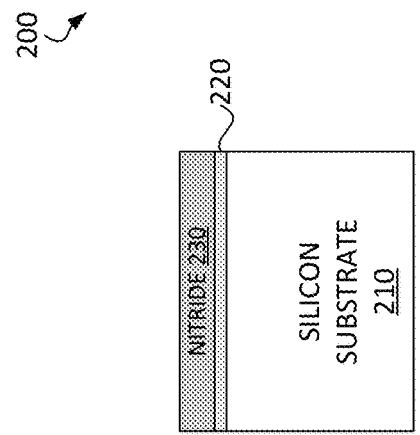
FIGS. 2A-2F illustrate an exemplary photolithography process.
Figure 2B:
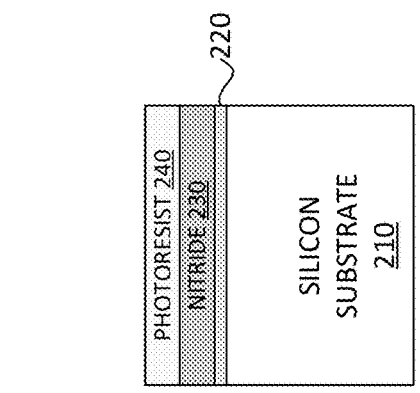
Figure 2C:
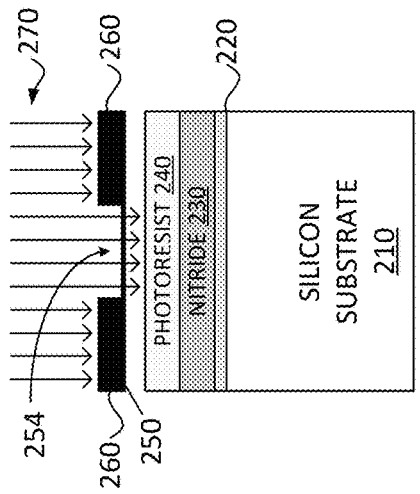
Figure 2D:
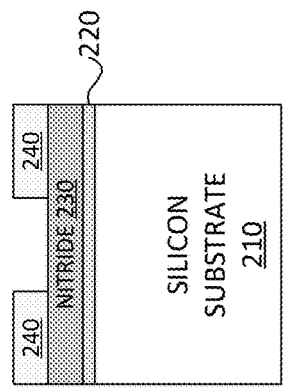
Figure 2E:
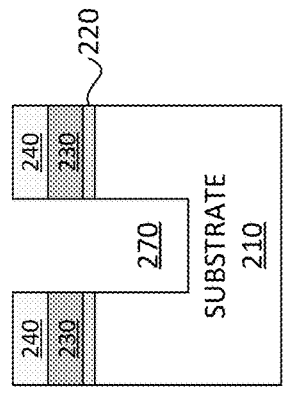
Figure 2F:
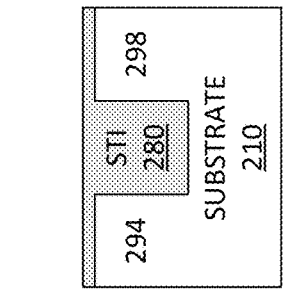

FIGS. 2A-2F illustrate an exemplary photolithography process. Process 200 illustrates how the oxide regions 182 in FIG. 1B can be defined using photolithography. In FIG. 2A, a thin silicon dioxide layer 220 is thermally grown across the top of silicon substrate 210 of a wafer. Silicon nitride layer 230, a protective layer, is deposited on top of silicon dioxide layer 220. In FIG. 2B, photoresist 240 is deposited on top of nitride layer 230. A photoresist is a material whose reactance to an etchant or solvent increases (if a positive photoresist) or decreases (negative photoresist) upon exposure to light. In process 200, photoresist 240 is a positive photoresist. In FIG. 2C, mask 250 with patterns 260 is positioned over the wafer and exposed to light 270. The light 270 passes through transparent region 254 of mask 250 and exposes photoresist 240. Patterned regions 260 are opaque to light 270 and the photoresist regions under patterns 260 are not exposed. In FIG. 2D, photoresist 240 is chemically developed and the exposed regions are dissolved. The remaining portions of photoresist 240 can now act as an on-wafer mask to allow for selective processing of the wafer. In FIG. 2E, the wafer is subjected to an etch step that removes a portion of the silicon nitride layer 230, silicon dioxide layer 220, and substrate 210 to create trench 270. In FIG. 2F, the photoresist and nitride layers are removed, and trench 270 is filled with silicon dioxide to create shallow trench isolation (STI) region 280 that serve to keep transistors formed in regions 294 and 298 electrically isolated from each other.

As masks are the means by which features are realized in semiconductor devices, any semiconductor device design must ultimately be reduced to a physical design, the level of design abstraction from which masks are generated. The physical design of a transistor (such as FIG. 1A), circuit, or processor to be manufactured is often referred to as a "layout." Electronic design automation (EDA) tools allow processor architects and circuit designers to design at levels of abstraction above the physical design level. They are thus spared from having to spend their days drawing polygons in layout tools to realize their designs. Architects typically define their designs using a hardware design language (HDL), such as VHDL or Verilog. Once they have verified that their designs perform as desired, a physical design can be generated automatically using a library of standard layout cells. Circuit designers often seek performance or functionality not available using standard cells and often enter their designs into a schematic capture tool. Once their custom designs are finalized, the circuit schematics are handed off to layout designers who manually craft the custom physical designs.

Regardless of whether a physical design is generated automatically or manually it must conform to a set layout design rules established for a manufacturing process. Design rules are constraints that a physical design must follow to ensure manufacturability. Most design rules express a minimum width or space for a feature, such as, "gate length 10 nm," "source/drain diffusion enclosure of a contact 16 nm," and "space between metal-1 traces 20 nm." Design rules represent a trade-off between feature density and manufacturability. Being able to print smaller feature sizes can mean more die can be packed onto a wafer but if the process cannot reliably print the smaller features, the resulting reduction in wafer yield can more than offset cost reduction gained by being able to print more die on a wafer.

Developing design rules for a new process can be difficult as unexpected difficulties can arise. For example, a feature may not scale as much as expected from the previous technology generation due to unforeseen difficulties with a new processing step or a new tool. As process engineers develop a new manufacturing process, they continually fine-tune the individual processing steps to remove as many defect sources as possible. At some point, the process has been tuned enough that the remaining defects that need to be rooted out occur so infrequently that they are difficult to find. Process engineers need to find the occurrence of these rare events during process development so that they can determine whether a tweak to the process can be figured out to reduce the occurrence of the rare event, or to add a design rule to the design rule set so that physical design geometries and patterns correlated to a specific defect are kept out of the final physical design.

Once a physical design is clear of design rule violations and has passed other design validation checks, it is passed to the mask generation phase of an EDA flow. The mask generation phase is far from trivial due to the large discrepancy between the wavelength of the light ($\lambda$=193 nm) that has been used since the 90 nm technology node and the minimum feature sizes (10 nm) used in the current processes. The minimum feature size that can be printed clearly in a photolithographic process is limited by the wavelength of the light source used and the semiconductor industry has developed resolution enhancement technologies (RET) to allow for the printing of features well below the 193 nm light source wavelength. A first set of RET techniques works to increase resolution and/or depth of focus, and a second set compensates for distortion effect due to printing features with a wavelength larger than minimum feature sizes as well as those inherent in deposition, etching, and other process steps. The first set includes techniques such as phase-shift masks and double-patterning, and the second set includes optical proximity correction (OPC).

Figure 3A:
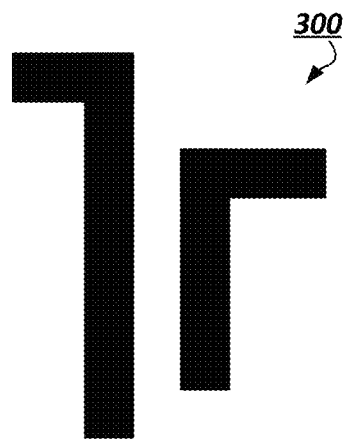
FIGS. 3A-3D illustrate the differences between as-drawn physical design features and as-printed wafer features due to process distortion effects and the use of optical proximity correction to counter those effects.
Figure 3B:
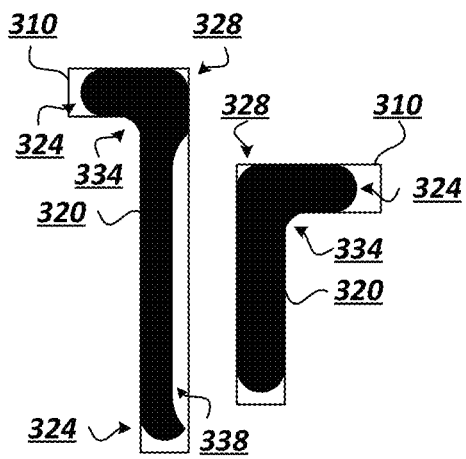
Figure 3C:
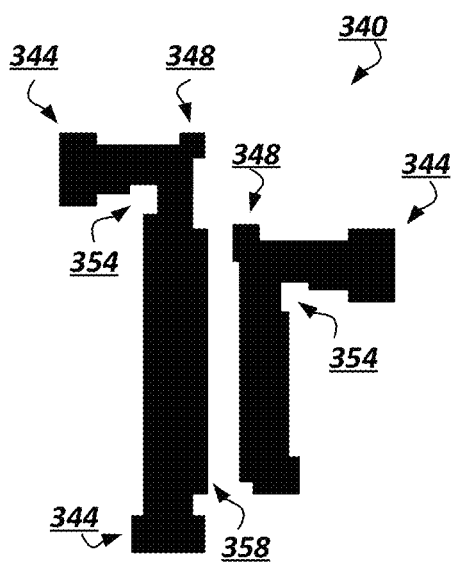
Figure 3D:
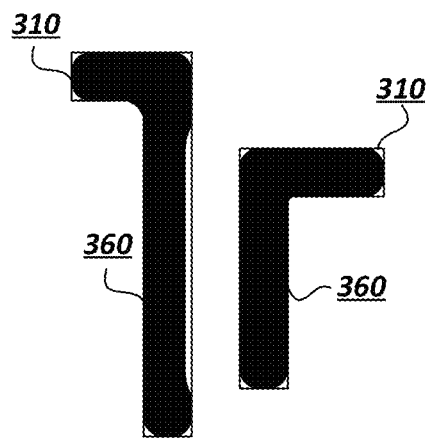

FIGS. 3A-3D illustrate differences between features printed on a mask and those processed on a wafer due to process distortion effects and the use of optical proximity correction to counter those effects. FIG. 3A illustrates two gate polygons 300 in a physical design before being subjected to an OPC process. FIG. 3B illustrates a simplified view of how polygons 300 may appear as processed on a wafer. Outlines 310 represent the boundaries of polygons 300 and shapes 320 represent the corresponding as-processed features. It can be seen that ends 324 and exterior corners 328 of shapes 320 are rounded off, interior corners 334 are filled in, and segment 338 narrowed due to a nearby feature. FIG. 3C illustrates exemplary modified polygons 340 generated by subjecting polygons 300 to an OPC process. Modified polygons 340 are much more complex than original polygons 300. Modified polygons 340 include "dog-bone" features 344 that compensate for end-rounding, "ear" features 348 that compensate for exterior corner-rounding, "mouse-bite" features 354 that compensate for interior corner-rounding, and thickening features 358 that compensate for the presence of nearby features. FIG. 3D illustrates a simplified view of how modified polygons 340 may appear on a wafer after processing. Outlines 310 again represent the boundaries of original polygons 300. As can be seen, modification of polygons 300 by the OPC process results in printed shapes 360 that are closer to the shape and size of original polygons 300. The ends and corners of shapes 360 are less rounded off, the interior corners are less filled in, and the impact of nearby neighbors is diminished.

While OPC generation (and other RET techniques) have allowed minimal features to scale with technology node as the wavelength of the photolithographic light source has remained constant, it does not come without its costs. OPC generation is computationally intensive. OPC recipes can be based on physical models of various processing steps (photolithography, diffusion, etch, deposition, etc.), or be rule-based models that generate OPC features based on individual physical design feature characteristics (width, length, shape, nearest-neighbor characteristics) without relying on the physics of the underlying process steps. The application of model-based OPC recipes to a complete physical design may involve the application of physical models to over 10 billion shapes at the gate layer alone and to billions of additional shapes on other layers. Further, the generation of rule-based OPC models, which may save some of the computational complexity of model-based OPC generation, can be a complex affair. Generation of rule-based OPC recipes can be based on trial-and-error due to a lack of full understanding of the complex physics and chemistries at play in the development of cutting-edge processing technologies. This trial-and-error can comprise iteratively manufacturing features with many variations of candidate OPC recipes and seeing which recipes produce the best results.

Figure 4:
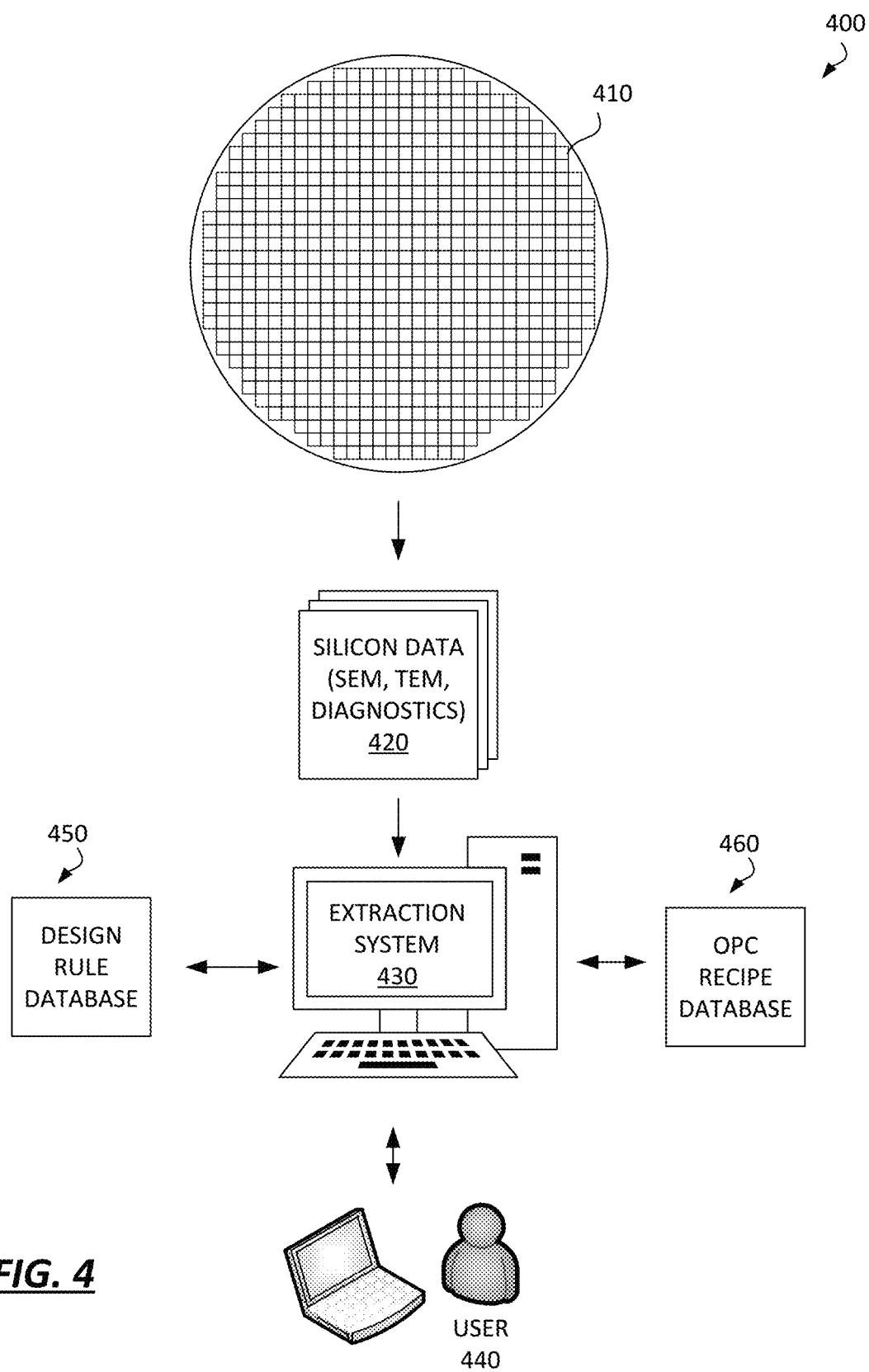
FIG. 4 illustrates an embodiment of how silicon data can be captured in a manufacturing process and provided to a system employing technologies described herein to aid process development and monitor process health.

FIG. 4 illustrates an embodiment of silicon data capture and utilization of silicon data to aid semiconductor manufacturing process development. Silicon wafer 400 comprises dies 410. As discussed earlier, current technology nodes employ 300 mm wafers, which can comprise hundreds of dies. The dies are separated by scribe lines that can contain test structures that can be used to monitor the health of manufacturing process and that are consumed by the dicing process, where a wafer is cut into individual dies 410. During the manufacture of silicon wafer 400, silicon data 420 can be generated that can be used for the development of a new process or to monitor the health of a mature one. Silicon data 420 can be any data collected during the manufacturing of wafer 400, including SEM (scanning electron microscopy) images, TEM (transmission electron microscopy) images, and diagnostic data. Diagnostic data can include data collected from the scribe line test structures, which can measure electrical properties of varies features or layers (e.g., contact or via resistance, metal layer sheet resistance), or indicate the presence of manufacturing defects by testing for shorts between, for example, gate or metal structures that reflect minimum features or layout patterns of concern.

Any number of SEM images can be generated per wafer. SEM images can be taken of one or more areas of interest on an individual die for various die on a wafer. For example, SEM images may be taken of the gate layer in a region where the gate patterns are particularly dense (such as in a memory array) and for representative dies across the wafer to capture cross-wafer manufacturing variations. SEM images can be taken at any point in the manufacturing process. As SEM images can capture a field of view that is hundreds of microns in length and width, individual images can contain many instances of minimum features or areas of interest.

Silicon data 420 can be generated for wafers processed during process development or monitoring and can be generated for wafers processed across fabrication facilities to evaluate cross-facility manufacturing robustness. Given today's large wafer sizes, process complexities, and wafer run rates, the amount of silicon data that can produced during process development or monitoring can be tremendous. The number of SEM images generated during process development alone can reach into the millions.

In some implementations, silicon data 420 can be supplied to a pattern extraction system 430 that digests copious amounts of silicon data and presents to a process engineer or other user 440 information that may useful in developing a new process or improving an existing one. In some examples, the information provided can be semantic patterns (phrases or sentences that are easily understandable by a human) that suggest which physical design patterns or geometries may be responsible for a defect. In other examples, system 430 can determine one or more design rules that may improve process yield and update design rule database 450 for a process or update an OPC recipe database 460 by updating an existing OPC recipe or creating a new one that may improve yield. In some implementations, the system 430 may identify particular sub-patterns or geometries of interest (e.g., which positively or negatively impact yield, etc.). Data generated by the extraction system 430 may be used, in some instances, as the basis for a reference geometry in a search query or during the construction of a chip layout search index, such as described in more detail below, among other example uses.

As discussed above, modern chips may constitute billions of transistors and other circuit elements, based on their respective designs. Techniques have been developed to test chips both during design and manufacturing time, to determine the quality (e.g., yield) of the manufacturing process and/or chip design. Given the enormous number and complexity of structures in the chip, it is often prohibitively expensive to test the entirety of a wafer or even the entirety of a single chip or layer (reticle) of a single chip. Accordingly, in many instances, testing strategies focus on testing sections, or samples, of a chip, and inferring or assuming quality based on tests of these samples. These (and more involved, comprehensive) tests may be performed in order to identify "problem areas" affecting a particular chip design. For instance, certain portions, or sub-areas ("neighborhoods") of a chip layout may be identified as the source of various problems (e.g., affecting yield results, hardware errors, etc.). For instance, specific elements, or groups of elements, may be identified as the potential sources of issues affecting a particular chip design, the elements implementing utilizing semiconducting fabrication techniques, such as discussed above. Accordingly, in some implementations, chip elements, believed to be the source of an issue, may be implemented by defining particular geometries, polygons, shapes, etc. to embody the element through the generation of corresponding masks to etch/deposit the elements according to these corresponding geometric patterns (referred to herein as "reference geometries"). Indeed, a pattern search (e.g., to identify a list of all locations in a large layout that match the given geometric configuration of a particular reference geometry) may play a critical role in many chip design and manufacturing application (e.g., predicting the impact of a yield-limiter pattern by identifying its number of occurrences in the design).

When a particular reference geometry is identified as being of interest, either at design, tape-out, manufacturing, or debug time, it can be particularly difficult to determine whether and to what degree that reference geometry is repeated (and in what contexts) within a particular chip layout. Indeed, given the sheer breadth of a modern chip layout, terabytes of information may be used to represent the chip layout. Conventional approaches of using a brute-force algorithm to match every location in the search space to instances of particular elements (represented by corresponding reference geometry) may utilize significantly large compute resources making real-time search infeasible. While some systems may attempt to improve upon brute force approaches by generating a single hash for each distinct geometric neighborhood to help in finding the exact matches to the neighborhood quickly, such brute force hash-based solutions may also result in large data sizes and similarly fail to provide a viable, real-time solution. Indeed, traditional layout searching techniques are impractical, inefficiently time consuming, and computationally expensive, among other example issues.

An improved chip layout search engine may be provided to resolve at least some of the example deficiencies above, among other example issues. For instance, an improved search engine may enable real-time fast searches that can identify all instances, in a given chip layout, matching a given reference geometry. Such improved search engines may be utilized improved algorithms leveraging graph-based index structures, hashing, and bloom filters, among other example technology (implemented in hardware circuitry and/or executable software/firmware). For instance, turning to FIG. 5, a simplified block diagram 500 is shown illustrating an example system 505, which may enable improved searching of chip layout data for various reference geometries, such as introduced above. An example system may include a search engine system 505 (e.g., implementing an improved search engine 520), an index engine 515 (e.g., to implement an indexer 570 to build a corpus of indexes (e.g., 535) for use by the search engine 520), and one or more source systems (e.g., 510) to provide samples or reference geometries as inputs/queries to the search engine 520. In some implementations (such as illustrated in the block diagram of FIG. 5), the search engine system 505, source system 510, and index engine 515 may be implemented by multiple physical systems (e.g., interconnected through one or more networks 590). Alternative implementations of the example system may instead be implemented by a single computing system. In still other examples, one of the example systems or subsystems illustrated herein (e.g., 505, 510, 515) may be implemented using multiple computing systems (e.g., in a cloud-based or otherwise distributed computing system), among other example implementations.

In one example, a search engine system 505 may implement an improved search engine 520 capable of performing fast searches of extraordinarily large and detailed chip layouts or other mappings including large collections of various geometries (e.g., on the order of billions or trillions of distinct polygons and other shapes). An example search engine 505 may be implemented using one or more data processing devices (e.g., 516), one or more machine-readable memory elements (e.g., 518), among other components implemented in hardware and/or software of the search engine system 505. A user interface (UI) 522 may be provided in connection with a search engine 520, to enable users to provide a reference geometry as a query to the search engine 520. In some instances, the UI may be a graphical user interface (GUI) and may provide tools to enable a user to define or submit a particular reference geometry as an input to the search engine 520 (e.g., to upload a file depicting or otherwise describing the reference geometry, to sketch or outline contours and dimensions of the reference geometry, among other examples). The UI 522 may likewise enable results of the search to be returned and presented to the user (e.g., as data usable by the user to understand where the reference geometry appears within a given subject chip layout, as a data formatted for use by another system or computer-implemented tool (e.g., a testing, debug, design, or diagnostic tool), among other examples.

In some implementations, an improved search engine 520 may include logical sub-modules implementing logic of the search engine 520 and enabling corresponding functions and features of the search engine 520. For instance, in one example, a search engine 520 may include components such as a polygon encoder 524, a polygon hasher 526, a bloom filter generator 528, a bloom-filter based search module 530, a geometric hash search module 532, a Boolean geometric search module 534, among other example modules and sub-modules. For instance, in some implementations, in order to normalize or otherwise prepare input data submitted as a query to the search engine 520 and describing a particular reference geometry) for processing by the search engine 520, the search engine 520 may parse the input data and translate the description of the reference geometry into a standardized format or encoding. For instance, a particular encoding may be defined for the search engine, according to which each polygon in a chip layout is described (e.g., in search indexes 535) and each polygon in a reference geometry is to be likewise described in order to facilitate the search. For instance, a polygon encoder 524 may be utilized to encode reference geometry described in a submitted query in accordance with the defined encoding definition used by the search engine and the indexes (e.g., 535) it searches.

In some implementations, hashing may be utilized to facilitate fast searching and domain filtering performed in connection with the searches by the search engine 520. For instance, a polygon hasher 526 may be provided, which may utilize one or more hash functions to convert the encoded version of individual polygons included the reference geometry into corresponding hash values. In some implementations, a polygon hasher 526 may be further used to generate additional hashes from the reference geometry. For instance, a reference geometry may be composed of a single polygon or a combination of multiple polygons (e.g., multiple instances of the same polygon or instances of different polygons). When a hash has been determined for each of the composite polygons of the reference geometry, the geometric relationship (e.g., relative positioning) of the polygons may be determined and likewise expressed as an encoding, which may be fed to a hash algorithm to generate an additional hash value for the reference geometry (e.g., a hash with inputs that include the polygon hashes and information describing relationships between each respective pair of polygons present in the reference geometry), among other examples.

In some implementations, one or more of the hash values generated by the search engine 520 may be utilized as the basis of generating a bloom filter for the reference geometry (e.g., using bloom filter generator 528). In such implementations, the search engine 520 may have multiple representations of the subject reference geometry available for use in completing an efficient search of one or more search indexes 535 to determine whether a match exists with the represented reference geometry (e.g., if instances of the reference geometry are present in the geometries of chip layouts represented in the search indexes 535). In some implementations, a separate search index may be provided for each one of potentially multiple chip layouts, for which a geometry search is supported by the search engine 520. In such instances, a query submitted to the search engine 520 may not only identify the reference geometry to be matched, but may further identify one or more target chip layouts to be searched. In some implementations, multiple chip layouts may be searched at once by the search engine 520 to identify instances of a particular reference geometry. In such instances, the search engine 520, in response to the query (and identification of multiple chip layouts) may identify those indexes (e.g., 535) that correspond to the identified chip layouts of interest. In some implementations, each index may identify a respective reticle or layer of a multi-layer chip layout. Accordingly, in such implementations, multiple indexes may be accessed and searched to search for the presence of a particular reference geometry appearing in any one of the multiple layers of a particular chip, among other examples and implementations. In other instances, a multi-layer index, or database, may be generated based on scans of each of the layers of a particular IC layout. In some instances, a search engine query may identify or provide information (e.g., hints) to the search engine to identify which of the layers to limit the search to. In other instances, the search engine may utilize machine learning or other techniques to infer, from a submitted reference geometry in a query, which layer (and corresponding index data structures) to search for the presence of the reference geometry, among other example features.

As discussed above, a search engine 520 may convert a submitted representation of a reference geometry into multiple different representations (e.g., an encoded representation, one or more hash values, a bloom filter, etc.). Various search stages may be supported by the search engine 520 and may be used to implement an improved search of a chip layout (or another dense geometry domain). Search stages may be utilized to filter the search domain to identify smaller subdomains to concentrate search-related operations. For instance, a bloom filter search 530 may provided (e.g., and use a bloom filter representation generated for a given reference geometry) to compare a reference's bloom filter with the respective bloom filters generated for each one of the defined subdomains of the target chip layout (which may be recorded in a corresponding search index 535). A bloom filter search may be utilized, in some implementations, to quickly reduce the scope of the search, by identifying a much smaller subset of the overall domain to concentrate the search (e.g., by identifying a subset of much smaller subdomains (each representing respective sub-areas of the overall chip layout area), which may possibly contain the reference geometry). For instance, a search index (e.g., 535) may include, for each subdomain, a polygon bloom filter populated based on each distinct polygon present in the subdomain (e.g., with each know polygon assigned a bit in the polygon bloom filter). A polygon bloom filter may be utilized, in some implementations, by the search engine 520 to determine which subdomains do not have even a single instance of the particular polygons included in the combinations of polygons of the reference geometry to quickly rule out these subdomains. In some implementations, a search index 535 (e.g., implemented as a database) may also (or instead) include a polygon pair bloom filter, which is populated to identify each and every distinct polygon pair in the subdomain. A polygon pair bloom filter may also be efficiently used (e.g., by the bloom filter search module 530) to quickly rule out subdomains that do not possess the combination of polygon pairs (e.g., identified by hashes based on the respective polygon geometries in the pair and the distance (e.g., in x- and y-coordinates) between the polygons in the pair) in the reference geometry. Where multiple bloom filter searches are performed (e.g., in a bloom filter search stage performed by the search engine 520), they may cumulatively filter down the subdomains considered by the search engine 520 (e.g., a polygon bloom filter search reducing the overall subdomains to a first subset of subdomains, and the polygon pair filter search being performed on the first subset of subdomains to further reduces the subdomains to a second, smaller subset of subdomains, etc.).

By reducing the scope of the search, the search engine 520, in some implementations, may perform more resource intensive search stages, such as a hash-matching search (e.g., using hash search module 532), for instance, to identify collisions in the bloom filter search and further reduce the number of subdomains in which instances of the reference geometry may be present. For instance, in some instances, trillions of possible polygon pairs may be possible, resulting in multiple polygon pairs being assigned the same bit in some examples of a polygon pair bloom filter. While a bloom filter search may indicate the possibility of a match, the match may be a false positive due to a collision in the filter. Accordingly, a hash match may be performed to determine if polygon hashes or polygon pair hashes generated for the reference geometry, match the polygon hashes or polygon pair hashes generated for the geometry of the subject subdomain, to further determine, in relatively quick order, whether the subdomain's geometry should be searched further. If the bloom filter search stage, a hash filter stage, or other "preliminary" search stage identifies that there are no possible matches within a subject chip layout, more resource intensive later search stages may be foregone completely, and a "no hits" result returned to the user. In instances where a small, manageable subset of the subdomains are identified through the preliminary search stages (e.g., performed through search modules 530, 532, etc.), a more in-depth search stage may be performed to identify, with precision (e.g., using Boolean geometric operations, bit- or pixel-wise comparisons, etc.) whether the reference geometry is or is not present within these targeted subdomains. Based on this final in-depth analysis, a precise search result may be generated. In some cases, in-depth searches within the targeted domains may be performed through multi-processing (e.g., by performing the in-depth search stage on each identified subdomain in parallel using parallel computing resources), among other example enhancement to further quicken the search. When matches are identified through the search, the search results may identify, not only whether and how many instances of the reference geometry were found to be present within a given chip layout, but may also identify locations (e.g., coordinates) within the layout (e.g., corresponding to the targeted subdomains) in which each of the instances were found. This information may be utilized to help designers, debuggers, etc. understand the scope of an issue associated with the reference geometry, among other example uses.

In some implementations of a search engine, searches may be recorded or cached. For instance, as discussed in the examples above, one or more representations (e.g., encodings, hashes, bloom filters, etc.) may be generated for a given reference geometry. In some implementations, copies of these representations may be stored by the search engine (e.g., as pattern records 360). In some instances, a subsequent query may be for another reference geometry that includes a previous reference geometry or one or more of the polygons within a previous reference geometry. In some implementations, pattern records 360 may be accessed to more quickly access the respective representations of a new query (e.g., bloom filters), among other example uses.

In some implementations, reference geometries may be provided and serve as the subject of queries of a search engine 520 in connection with one or more tests, checks, or validations of a particular chip design. Various source systems (e.g., 510) may be provided, from which reference geometries may be identified. As one example, a source system 510 may be implemented as a computing system including one or more data processing devices (e.g., 562), one or more machine-readable memory elements (e.g., 564), among other components (e.g., 565) implemented in hardware and/or software of the source system 510. Source systems may serve, host, or be used to develop, test, or analyze various chip layouts (e.g., described in layout design data 566). A test system (e.g., 565) or other logic of an example source system 510 may be utilized to identify particular geometries of interest. Such geometries of interest may be expressed as reference geometries within corresponding pattern data 568, which may be supplied as at least a portion of a query to the search engine 520. Pattern data 568 may take a variety of forms and describe the particular reference geometry photographically (e.g., as scanning electron micrograph (SEM) data), architecturally (e.g., using a portion of data generated using a computer-aided drafting (CAD) design tool representing a portion of a chip or circuit), using coordinate representations, vectorized geometry, among other examples. In some implementations, a search engine 505 may be adapted to accept and adapt pattern data 568 received in any one of multiple different formats. Additionally, in some implementations, layout data (e.g., 566) hosted by various source systems (e.g., 510) may be provided to index systems (e.g., 515) to generate search indexes (e.g., 535) corresponding to one or more chip layouts, which may be used by the search engine 520 to facilitate searches of the subject chip layouts, among other example uses.

An example index system (e.g., 515) may be provided in association with an improved search engine 520, for use in generating search indexes (e.g., 535) used by the search engine in detecting matches between various reference geometries and various chip layouts. In one example, an index system 515 may be implemented using one or more data processing devices (e.g., 572), one or more machine-readable memory elements (e.g., 574), among other components implemented in hardware and/or software of the index system 515. The index system 515 may implement an index engine 570 configured to generate search indexes (e.g., 535) for chip layouts, the search indexes particularly adapted for use with the search scheme employed by an improved search engine 520. In some implementations, the index engine 570 may generate indexes implemented as graph-based data structures (e.g., to further enhance the speed at which a search is to be performed). Additionally, an example index engine 570, when building an index for a particular chip layout or chip layout layer, may construct a number of different representations of the chip layout. Such chip layouts may correspond to the search stages implemented by the search engine 520 (such as discussed above).

In one example implementation, to facilitate a reduction in the search domain, an example index engine 570 may be implemented, which may take, as an input, a representation of a large chip layout and may subdivide the area of the chip layout into smaller subdomains (e.g., corresponding to equally sized sub-areas of the chip layout). In some implementations, this may be performed automatically by the index engine (e.g., to subdivide the domain into a number of subdomains (e.g., based on the compute and/or memory resources of the search engine system 505)). In some cases, a user input may be received to direct the index engine 570 into determining an appropriate number or dimensions of the subdomain to be defined by the domain manager 576.

In some implementations, a polygon detection module 578 may be provided, which may be configured to detect, in each of the defined subdomains, the polygons included in the chip layout. In some cases, polygon detection may be carried out independent of the subdomain definition performed by the domain manager 576. In some implementation, a graph index structure may be organized at the polygon level (e.g., with edges/children nodes of each detected polygon's node identifying the subject polygon's nearest neighboring polygons (and the distances/coordinates of these neighboring polygons relative to the subject polygon)). Indeed, polygon detection may include not only identifying and recording instances of each individual polygon in a chip layout, but also identifying each polygon "pair" in the chip layout. For instance, for each detected polygon, the polygon detection module 578 may determine which other polygons are "nearest" to the respective detected polygon. For instance, determining which polygons are "nearest", such that they may defined as a polygon pair, the polygon detection module 578 may include those polygons which are in the proximity of the subject polygon, but for which no other polygon is positioned between the subject polygon and the potential paired polygon. In other instances, a bounding distance may be defined, based on the dimensions of a layout and its geometry, such that any two polygons within the bounding distance (e.g., 2 microns) are considered a polygon pair, among other example techniques and pair detection algorithms or rules. Indeed, a polygon may have multiple polygon pairs (e.g., each of the polygons most immediately surrounding the subject polygon) and some of the polygon pairs may be closer (in distance) than others. The polygon detection module 578 may define links (e.g., in a graph structure) between each of the paired polygons, as well as identified the relative location of each polygon to its respective pair(s).

As noted above, in some implementations, an improved search engine 520 may employ an encoding scheme for describing the dimensions and contour of each respective polygon included in a reference geometry. Similarly, such standardized encoding may likewise be employed within an indexed version of a chip layout's geometry. For instance, the index engine 570 may include a polygon encoder 580 (e.g., similar to (or even implemented with the same logic as) polygon encoder 524) to encode each of the polygons detected in the layout in accordance with the encoding scheme and generate an encoded representation of each polygon. Similarly, hashed representations of each of the polygons may also be generated (similar to the hashed representation to be generated of polygons in each reference geometry received as a query of the search engine 520). For instance, a polygon hasher 582 may be provided in an index engine (e.g., 570) to generate a hash from the encoded representation of each of the detected polygons in the subject chip layout. Additional hashes may also be generated (including hashes which use earlier performed hashes as inputs). For instance, in some implementations, hashes may be generated for each of the detected polygon pairs detected in the chip layout.

Figure 5:
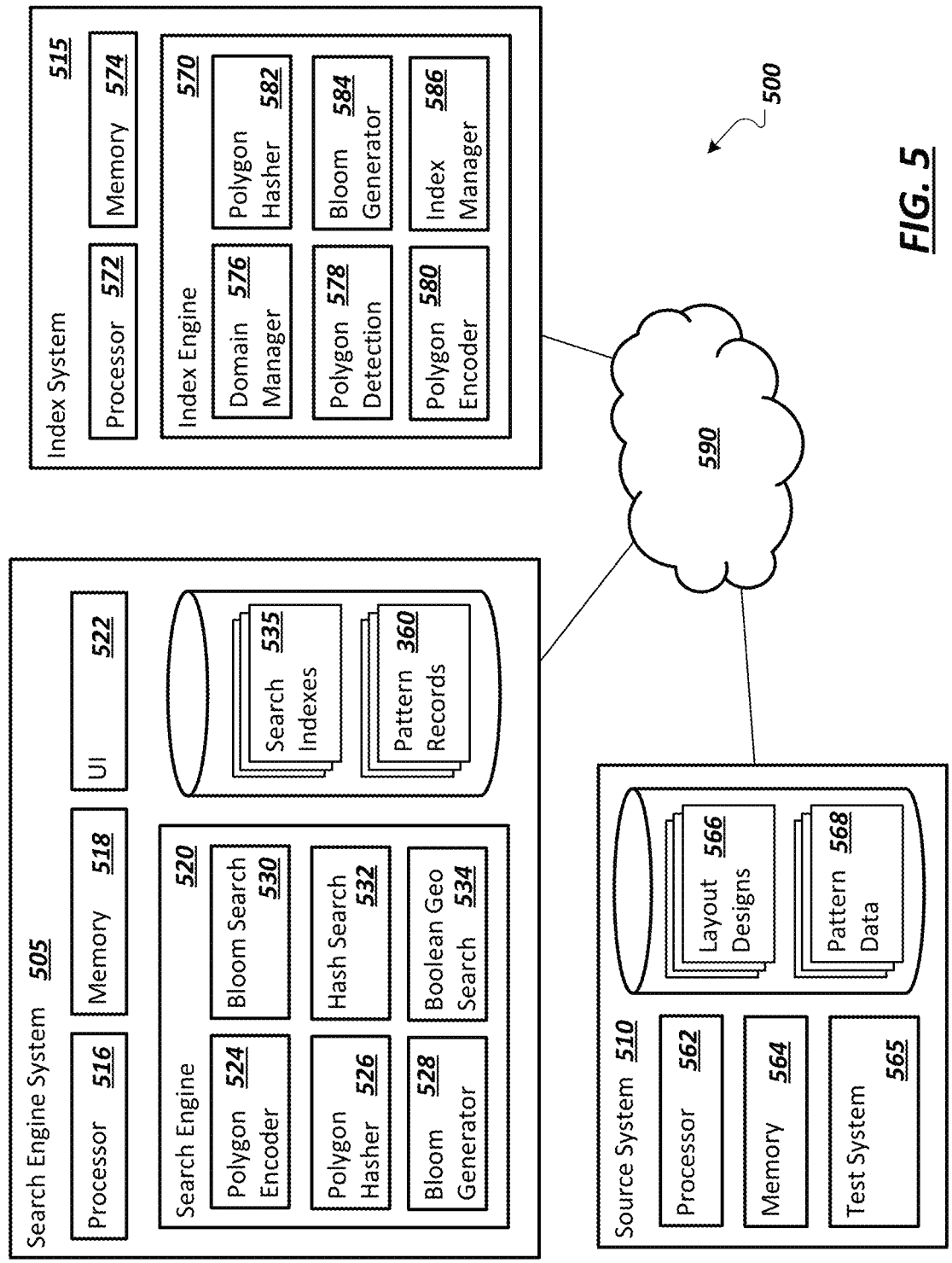
FIG. 5 is a block diagram of an example computing system implementing an improved search engine in accordance with some embodiments.

As discussed in the example of FIG. 5, in some implementations, an improved geometric search may include filtering the domains to be searched through the use of bloom filter search stages (e.g., performed by bloom filter search module 530). To support such searches, an index engine 570, when building a particular index (e.g., 535) for a particular chip layout, may generate a respective bloom filter for each one of the defined subdomains of the chip layout based on the constituent polygons and polygon pairs included (wholly or partially) within the subdomain. For instance, hashed representations of the individual polygons and/or polygon pairs may be utilized to generate one or more corresponding bloom filters for each of the subdomains. Such bloom filters may be utilized by a search engine 520 to quickly rule out large percentages of the subdomains in some searches, and expedite and reduce the overall domain of a search performed by a corresponding search engine (e.g., 520). For instance, a search index (e.g., 535) generated for a layout may include subdomain specific records or tables, and relationship data (e.g., polygon pair definitions) may be serialized to be stored in the search index 535. Likewise, bloom filters (e.g., polygon- or polygon pair bloom filters) and hashes (e.g., polygon hashes, polygon pair hashes, etc.) used to generate the bloom filters may also be stored in records corresponding to their respective subdomains, among other example implementations.

An example index engine 570 may include one or more additional components or sub-components to implement various features and functionality of an example index engine 570, such as an index manager 586 including logic to generate the data structure(s) used to implement the search indexes 535 used by the consuming search engine 520 and populate these structures with the values and representations determined using other modules of the index engine (e.g., 576, 578, 580, 582, 584, etc.), among other example features and implementations.

Figure 6:
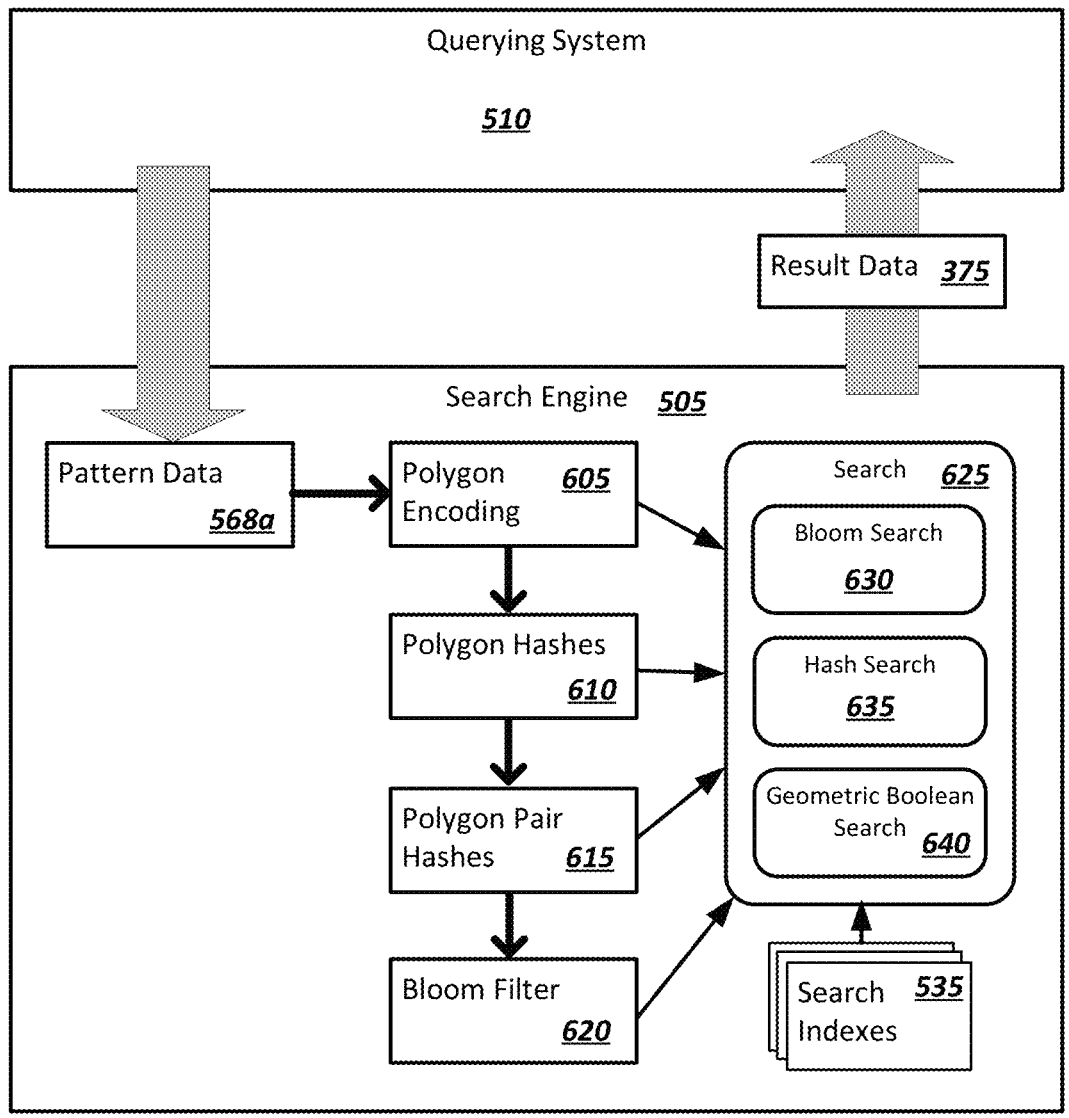
FIG. 6 is a block diagram illustrating an example search to identify whether a particular reference geometry is present in a graphical layout in accordance with some embodiments.

Turning to the simplified block diagram 600 of FIG. 6, an example flow is shown of an improved geometric search of a chip layout performed by an example search engine 505. In some instances, a search engine may correspond to searching a single chip layout. In other instances, the search engine 505 may have access to a collection of search indexes 535 enabling the potential search of any one of multiple different chip layouts (which have been previously indexed). Accordingly, a search query may involve both providing an indication of a reference geometry "search term" and an identification of one or more of the chip layouts (or indexes) to be searched, among other examples. For instance, a source system (e.g., 510) may provide pattern data 568*a* in connection with a query of the search engine 505, the pattern data 568*a* describing a particular reference geometry. The search engine 505, in some implementations, may receive the query (and the pattern data 568*a*) and convert the identified reference geometry into a standardized format using polygon encoding 605. In some implementations, each respective side of each polygon included in the reference geometry may be assigned a value in connection with an encoding scheme, and the collection (e.g., concatenation) of each side's determined value may be used to represent the entire polygon in the encoding, among other example implementations. The encoded value of each of the reference geometry's polygons may then be hashed according to a polygon hashing function (e.g., at 610) to generate a respective hash representing each polygon. It may be expected that encodings representing instances of polygons with the same dimensions and contours will yield the same hash values upon application of the polygon hashing function (at 610). The determine polygon hash values (at 610) may be further used to generate polygon pair hashes (at 615). For instance, for each detected polygon pair in a reference geometry, the polygon pair hash function may take, as inputs, the corresponding polygon hashes determined (at 610) for each of the polygons, as well as coordinate data describing the relative positions of the polygon pair to each (as well as potentially additional inputs) to generate polygon pair hash values for each of the polygon pairs detected in the reference geometry. The polygon pair hash values may then be used, in this example, to generate a bloom filter (at 620) for the reference geometry.

Continuing with the example of FIG. 6, the encoded version of the reference geometry's polygons and corresponding hash representations and bloom filter generated for the reference geometry may be used for the benefit of a fast-searching algorithm employed by the search engine 505. For instance, the search engine 505 may perform the search 624, in one example, by first performing a bloom filtering stage 630. For instance, the reference geometry's bloom filter(s) (e.g., polygon bloom filters and/or polygon pair bloom filter) may be compared against each of the subdomain-specific bloom filters previously determined for each subdomain in the targeted chip layout(s) being searched. For instance, a logical AND operation may be performed for each subdomain-specific bloom filter to determine whether bits set in the reference geometry's bloom filter are also set in a subset of the subdomain's specific bloom filters. The search 625 may continue with additional search stages, but for only those subdomains for which a bloom filter match was determined. For instance, a one or more hash-level search stages (e.g., 635) may be performed in each of the identified, relevant subdomains, for instance, to determine whether either or both of the polygon-specific hashes and/or polygon pair-level hashes of each subdomain match the polygon hashes and polygon pair hashes of the reference geometry. Determining such matches may additionally filter or reduce the number of relevant subdomains (or completely rule out the presence of the reference geometry in any of the subdomains of the chip layout). With the number of relevant subdomains minimized (e.g., through search stages 630, 635), an in-depth Boolean search of the remaining relevant subdomains may be performed to definitively determine whether the reference geometry is present in each of these subdomains. For instance, a geometric Boolean search 640 may be performed of each of the remaining subdomains to determine whether the reference geometry is present in the subdomain. Other search techniques may be additionally or alternatively employed in this reduced set of subdomains. Based on the results of these in-depth, geometry-level search stage(s) (e.g., 640) result data 375 may be generated identifying the results of the search, including identifying locations within the chip layout where the instances of the reference geometry were found.

Figure 7:
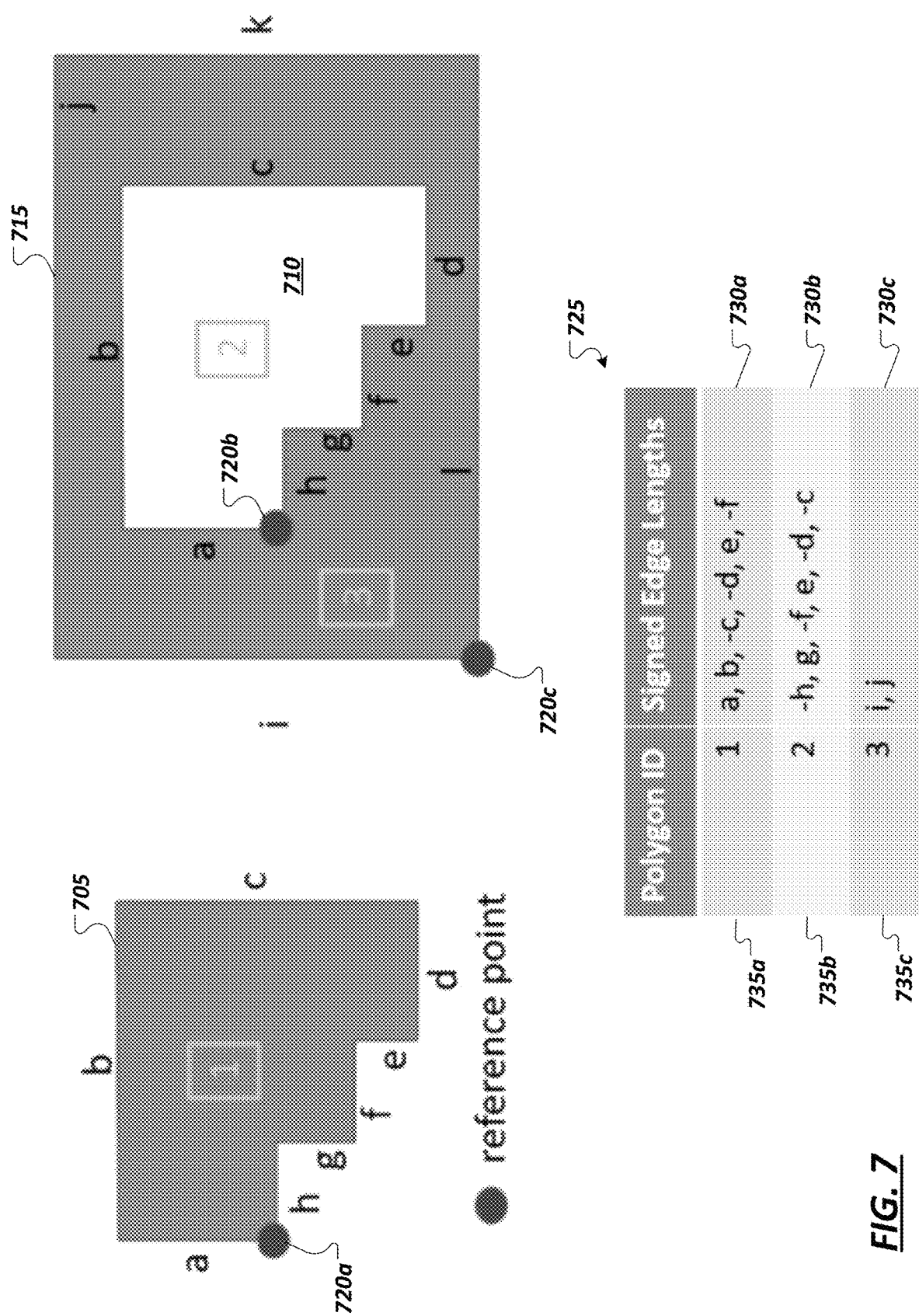
FIG. 7 is a simplified block diagram illustrating encoding of example polygons in connection with an improved search engine system in accordance with some embodiments.

Turning to FIG. 7, a simplified block diagram is shown illustrating principles, which may be employed in generating polygon encoding in connection with an improved geometry search of a chip layout, such as introduced in the examples above. FIG. 7 illustrates three example polygons 1 (705), 2 (710) and 3 (715). In some implementations, to facilitate encoding, a common reference point (e.g., 720a-c) may be defined to be used in the encodings. For instance, an encoding scheme may define that the lower most corner of the left-most side of the polygon serve as its respective reference point. This reference point may also be utilized to determine relative distances and/or coordinates separating on polygon from a neighboring polygon pair. For instance, if polygons 705, and 715 are defined as a pair, the relative positioning of the polygons may be defined based on the relative position of reference point 720a (of polygon 705) to reference point 720c (of polygon 715), among other example implementations.

Continuing with the example of FIG. 7, as noted above, to enable subdomain searching, the geometric space (e.g., chip layout design) being searched may be first converted into a compact searchable database through a graph structure, where the nodes of the graph are individual polygons detected in the geometric space, with the corresponding edge(s) and adjacent nodes storing the relative locations of neighboring polygons with respect to a reference location (e.g., 720a-c) on the polygon. Such graph-based representations, in some implementations, may be serialized for storage within a database implementing a search index for the corresponding layout design, among other example implementations.

Information concerning the individual polygons and polygon pairs, both in the subject chip layout and the reference geometry, may be encoded, such as discussed above, and stored with/in the index structure. For instance, as each polygon has multiple sides, a polygon may be represented through an encoding based on the respective sides of the polygon. For instance, as illustrated in FIG. 7, an example polygon 705 may include sides a-h, forming the outer perimeter of the polygon. Likewise, polygon 715 may include sides id. In one example implementation, polygons may be encoded based on their sides. For instance, signed edge length values may be assigned to each of the polygon's sides, based on the physical length of the side and whether it is positive in the −x or −y (or −z) direction. For instance, signed edge length values may be concatenated or stored as a vector or sequence to serve as the encoded version of the polygon. For instance, a description of an example polygon 705 may be encoded by beginning at the reference point 720a of the polygon 705 and moving clockwise around the perimeter to define the encoded description (e.g., a, b, −c, −d, e, −f, g, −h). When moving around the perimeter of the polygon, the direction traversed to get from one side to the next determines whether the side is assigned a negative or positive value. In some instances, as in the example of FIG. 7, the final two side lengths may be omitted from the encoding (e.g., as these values may be inferred from the preceding side length values. For instance, as shown in table 725, a polygon 705 may be encoded with a value {a, b, −c, −d, e, −f} and may assigned polygon ID 1. A similar encoding may be determined for polygon 715 based on its respective sides (e.g., assigned polygon ID 3 and encoding {I, j}, as shown in table 725). In some instances, polygons may be "negative polygons" or "holes", formed within the bounds of another polygon. As illustrated in the examples of FIG. 7, an example polygon 710 may be formed within polygon 715 as a hole. In one example encoding scheme, holes may be encoded by moving counterclockwise from the reference point (e.g., 720b) of the polygon (e.g., 710) and the values of the sides may be a negative value. For instance, in the example of FIG. 7, hole polygon 710 may be assigned polygon ID 2 and encoding {−h, g, −f, e, −d, −c}, among other example implementations and encoding schemes.

While the example illustrated in FIG. 7 shows an encoding scheme for encoding primarily rectilinear polygons, an example encoding scheme may be extended to also apply to general polygons. For instance, encoding sequences generated to represent corresponding polygons, in some implementations, may additionally include for each side (or for only those sides which are not rectilinear (vis-à-vis the other or majority of other sides in the polygon)) value indicating the relative angle of the side (e.g., relative to the reference point of the polygon, a preceding side, or some other reference). For instance, an alternative scheme may generate an encoding that indicates both the lengths of the sides and their respective angles, where the encoded sequence may include a value pair for each side, such as [length, angle]. As an illustrative example, for polygon 705, an alternative encoded sequence may represent the polygon, such as: {[a,90], [b,0], [−c,−90], [−d,180], [e,90], [−f,180]}, among other possible implementations.

The encoding values (e.g., 730a-c) determined for a polygon (either during indexing of a chip layout or for a submitted reference geometry in a search) may be used as the basis for determining a hash representing the polygon and thereby at least a portion of the reference geometry. For instance, in one example implementation, each unique encoding sequence (e.g., 730a-c) may be assigned a unique polygon ID (e.g., 735a-c), the polygon ID serving as the hash value for the polygon. In other instances, the encoding sequence may be provided an input to a mathematical hash algorithm to generate a hash value for the polygon, among other example implementations. According to some hash algorithms employed by the search engine or indexing engine, instances of polygons with the same encoding sequence (e.g., 730a-c) will be hashed to the same hash value (e.g., 735a-c). In some instances, hash algorithms applied in the generation of the search index and during hashing of reference geometry information may permit collisions (e.g., where polygons, polygon pairs, geometries, etc. may be hashed and generate the same hash value as that generated for a different polygon, polygon pair, reference geometry, etc.). Such collisions may be resolved by performing Boolean geometry searching to determine whether hash matches actually indicate a geometry-level match or are actually a false positive, among other examples.

Figure 8:
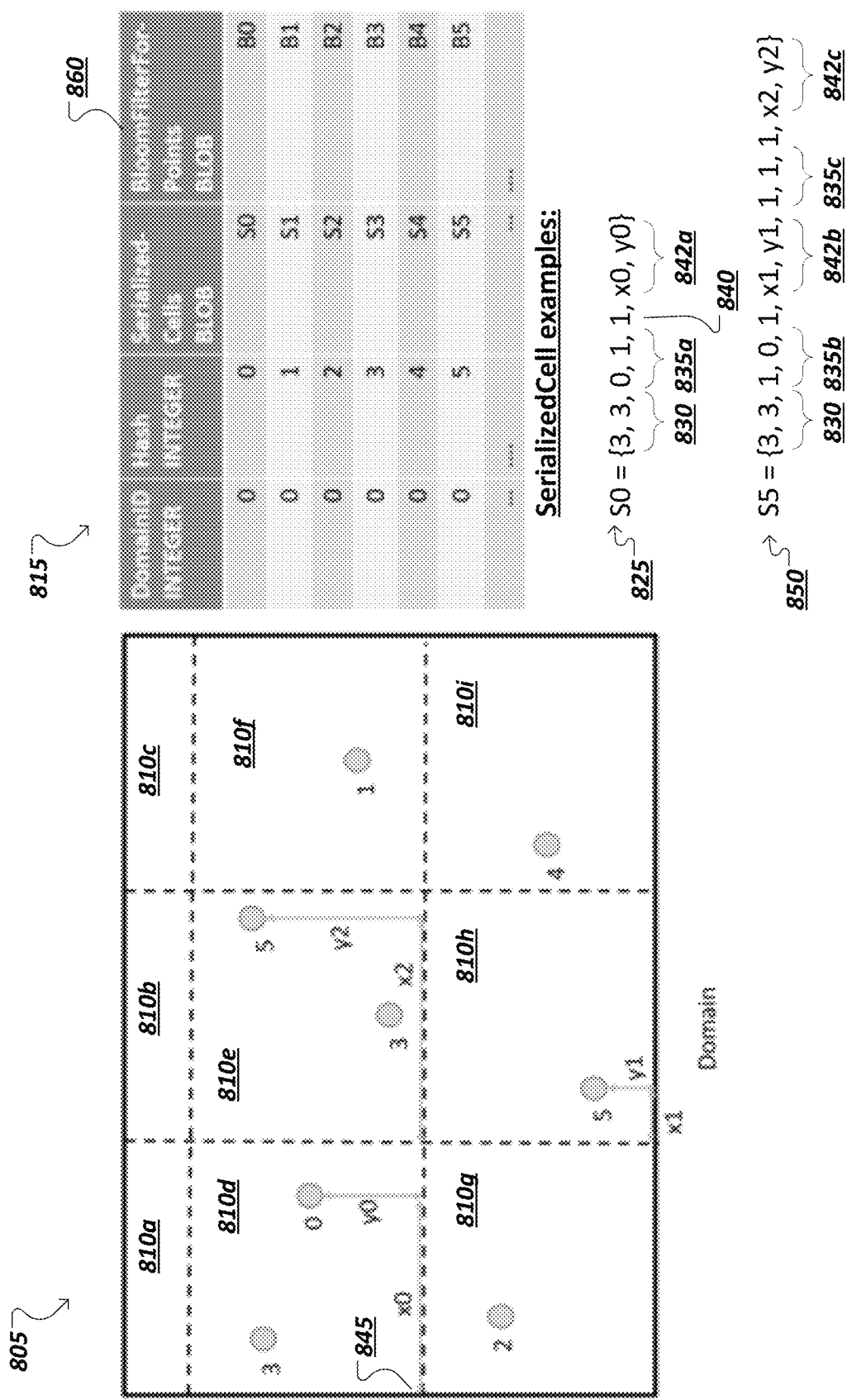
FIG. 8 is a simplified block diagram illustrating an example data structure developed for use with an improved search in accordance with some embodiments.

Turning to FIG. 8, during indexing of a subject chip layout, the overall area of the chip layout may be subdivided into exponentially smaller subareas, representing respective subdomains of the chip layout. Further, each subdomain may be subdivided by a respective coordinate grid, such as shown in the example portion of a subdomain 805 shown in FIG. 8. Instances of each of the identified polygons may be identified and mapped to each of the coordinate grid spaces (e.g., 810a-i) (e.g., based on which grid space the respective polygon's reference point falls). A data structure 815 (e.g., to be associated with or included in the corresponding search index) may be generated, with each record identifying instances of a particular polygon within respective subdomains of the layout. For instance, the data structure 815 may represent a serialization of a graph or other data structure used to represent a polygon, polygon pair, geometry, etc. In the example of FIG. 8, the data structure 815 represents a polygon-level information and corresponds to the particular subdomain. Similar data structures may be generated for other subdomains. In this example, each record (e.g., 820a-g) of the data structure 815 may identify each of the instances of a corresponding polygon within the subdomain. For instance, in a subdomain with DomainID=0 (as in the example of FIG. 8) instances of a particular polygon may be identified, which has a hash value 0 (e.g., generated according to an encoding and hashing scheme as discussed in the example of FIG. 7). In the example of FIG. 8, the particular polygon "S0" (with hash value "0") is detected within subdomain 0 once, in grid box 810d. A SerializedCell value (e.g., 825) is determined to describe (e.g., in a serialized form) the instances of polygon S0 in subdomain 0. For instance, values of the SerializedCell value 825 may indicate the manner in which the subdomain is divided (e.g., at values 830 (e.g., indicating that the subdomain has been subdivided into a 3×3 grid) and identify those grid boxes (e.g., through coordinates 835a) where instances of the S0 polygon were detected, and for each of those grid boxes, identify (e.g., at 840) the number of instances of the polygon found in that grid box. The SerializedCell value 825 may then identify, for each instance of the polygon found in that grid box, the coordinates 842a of the polygon's reference point in the grid box (e.g., as measured from a reference point (e.g., 845) of the grid box. For other polygons, multiple instances of the same polygon may appear multiple times within the same subdomain (e.g., as in the example SerializedCell value 850 generated for a different polygon with a hash value "5") and the SerializedCell value 850 may identify (e.g., at 835b-c) the locations of each of the grid boxes where the instances appear, the number of instances found in each grid box (e.g., at 840b-c), and the coordinates 842b-c of each instance as measured from the reference point of each respective grid box (e.g., grid boxes 810e,h), among other examples. An example data structure (of an example search index) may additionally identify (at 860), for each of the polygons described in the data structure, the respective polygon bloom filter bit assigned to that polygon, among other example information. Indeed, similar Serialized Cell values may be generated (to populate example table 815) and describe the instances of the other detected polygons (e.g., corresponding to hash values 1-4 in the example of FIG. 8, among other examples. Similar structures may also be generated for other geometric characteristics of the subdomain. For instance, a structure (e.g., similar to structure 815) may be generated to describe each polygon pair in the subdomain (e.g., to serialize the relationship and description of the polygon pair, identify a polygon bloom filter bit assigned to the polygon pair, etc.), among other examples.

Figure 9:
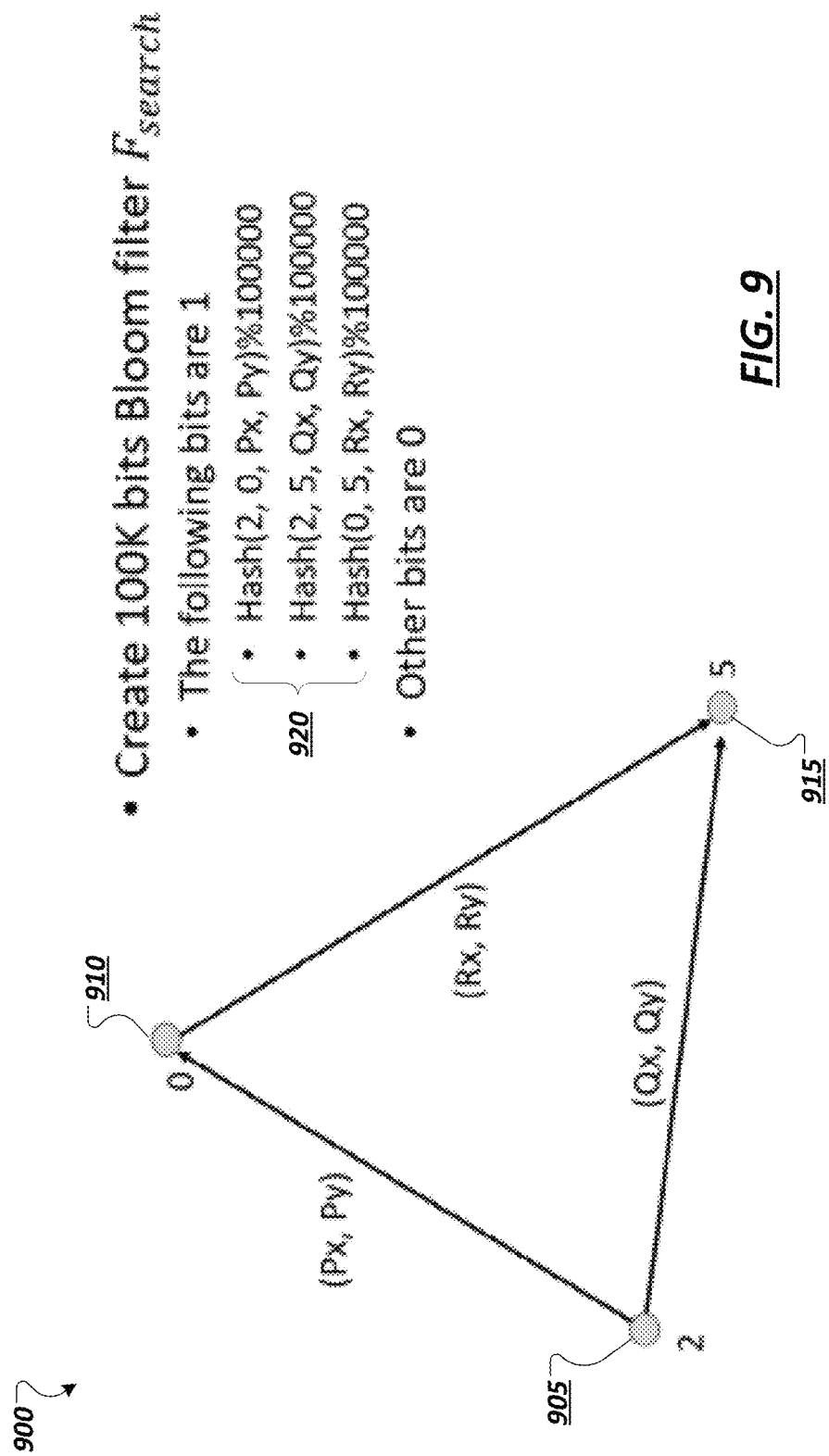
FIG. 9 is a simplified block diagram illustrating principles for generating example bloom filters based on polygon pairs in a geometry in accordance with some embodiments.

Turning to FIG. 9, a simplified block diagram is shown to illustrate how an example bloom filter may be generated in connection with an improved search engine, such as introduced above. FIG. 9 shows a representation 900 of a grouping of three polygons 905, 910, 915, as may be found in an example reference geometry or a portion (e.g., a subdomain or grid box of a subdomain) of an example chip layout design. An earlier encoding and hash may be performed to generate a respective hash value representing each of the distinct polygons 905, 910, 915 (e.g., where the hash value of polygon 905="2", polygon 910="0", and polygon 915="5"). Polygons 905, 910, 915 may be considered respective pairs of polygons (e.g., the pair of polygons 905 and 910, polygons 905 and 915, and polygons 910 and 915) in this simplified example.

In one example, hashes may be generated to populate the bits of a bloom filter for use by the search engine based on the identified polygon pairs. For instance, a bloom filter may be generated for each determined subdomain of a chip layout, where each bit of the bloom filter is to indicate whether a particular pair of polygons may be present in the subdomain. For instance, each bit may store a bit value corresponding to a hash function:

$$h=\text{hash}(p_1,p_2,d_x,d_y) \% n$$

where $p_1$ is the hash value for a first polygon in the pair, $p_2$ is the hash value for the second polygon in the pair, $d_x$ is the offset between the first and second polygons in the x-direction, $d_y$ is the offset between the first and second polygons in the y-direction, and n is the modulus value (e.g., n=100,000 or some other value). In the example of FIG. 8, a bloom filter F search may be generated according to formulas 920 corresponding to each of the three polygon pairs identified (e.g., in a reference geometry submitted to an example search engine). Similar bloom filters may be generated for each subdomain of the layout, with similarly hash operations performed for each of the polygon pairs identified in the subdomain to populate corresponding bits of the subdomain's bloom filter.

Continuing with the above example, the respective bloom filters generated for an index of subdomains and for a given reference geometry may be utilized to reduce the number of subdomains considered in latter stages to be performed in the search. For instance, a distributed query (e.g., using multithreaded or multiple cores) map be performed using the bloom filters to evaluate presence of the references geometry in any one of the subdomains, for instance, by performing an AND operation between the reference geometry's bloom filter and each subdomain's bloom filter. This operation may substantially reduce the search space of the more detailed geometry searching performed by the search engine. For instance, latter search stages may be performed in only those subdomains for which a successful match was determined (e.g., where for all "on" bits of the reference geometry's bloom filter, all corresponding bits were also set in the domain's bloom filter). For instance, for each successful match, first individualized hashes (e.g., at the polygon hash and/or polygon pair hash level) may be matched rigorously (e.g., to rule out cases where bloom filter collisions indicate potential presence of the reference geometry). Should any potential matches remain after performing hash-based searching, for each case matching the individual hash, a final rigorous Boolean search may be performed (e.g., to specifically compare the reference geometry to the actual geometry associated with the hash in the subdomain) to ascertain any potential matches in the chip layout with certainty, among other example stages and algorithms.

Figure 10B:
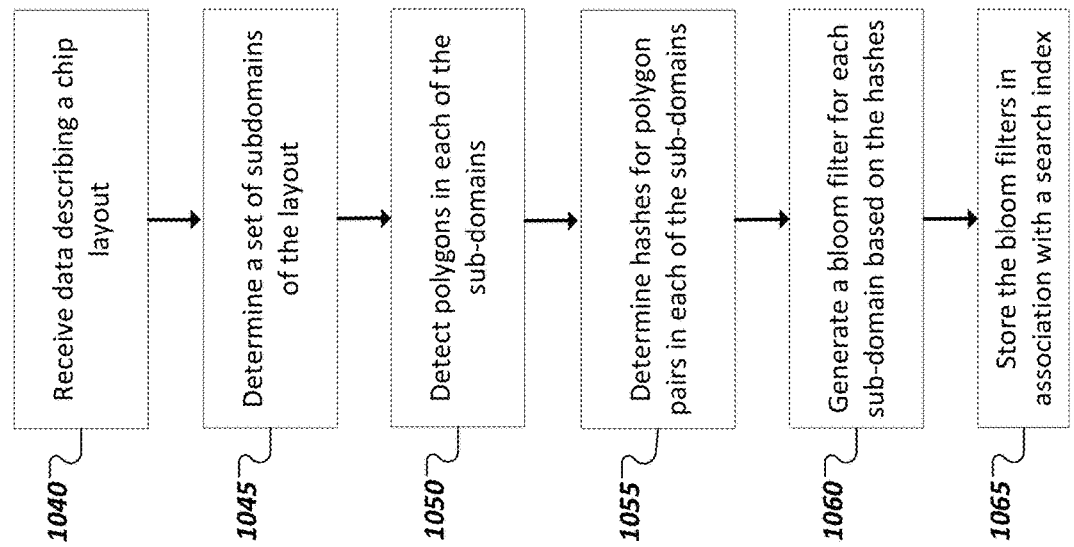
FIGS. 10A-10B are flowcharts illustrating example techniques for searching patterns.
Figure 10A:
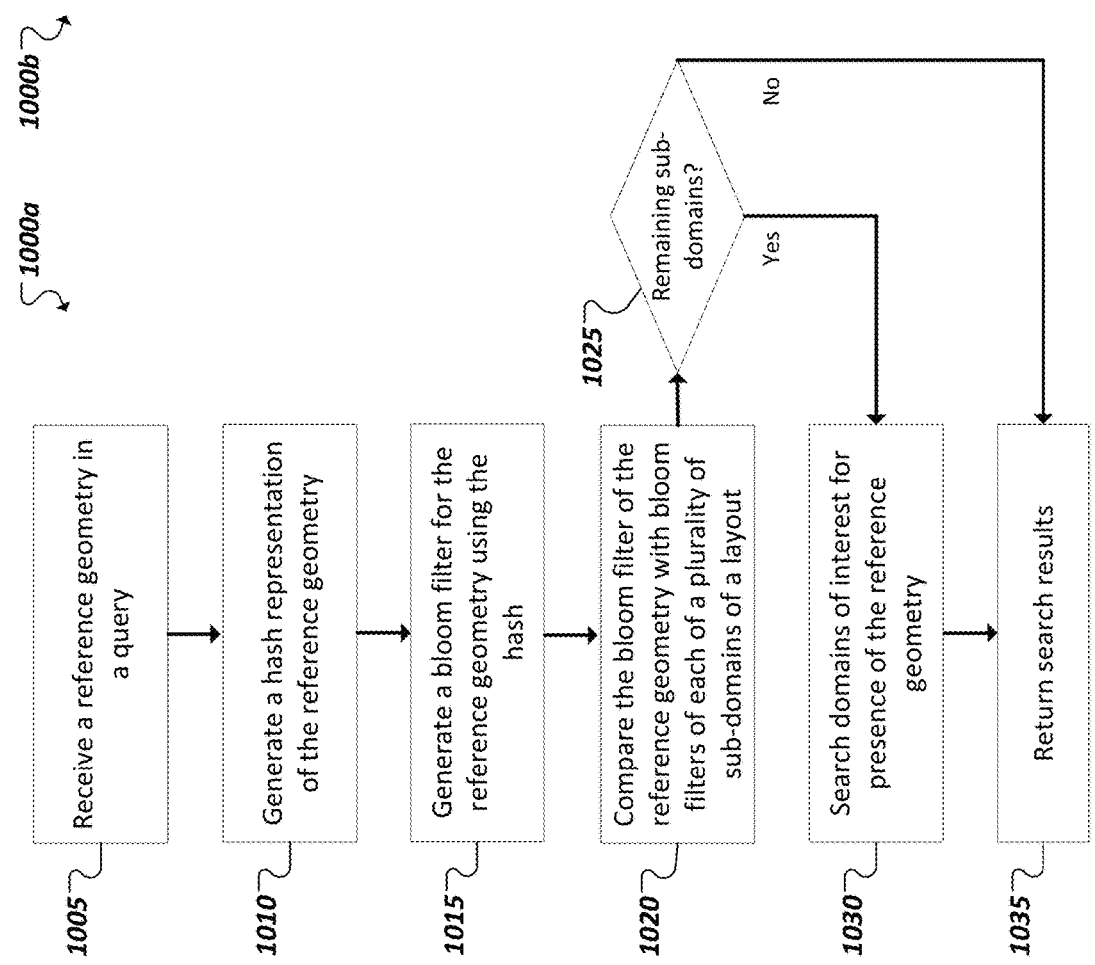

FIGS. 10A-10B are simplified flowcharts 1000*a-b* showing example techniques for use in implementing improved search of large, complex chip layout designs. For instance, in the example of FIG. 10A, a query may be received 1005 at a search engine system, the query including an indication of a reference geometry and requesting that the search engine search the layouts of one or more chip designs for instances of the reference geometry. A hash representation of the reference geometry may be generated 1020 and an instance of a bloom filter generated 1015 to represent the reference geometry. The bloom filter may be generated 1015 based on the generated hash representation(s) (e.g., by providing the hashes as one of the inputs to a hash function used to generate the bloom filter). In some instances, the hash representations and the bloom filter may be based on identifies pairs of individual polygons present within the reference geometry.

An example search may be performed to include comparing 1020 the bloom filter generated for the reference geometry against a collection of bloom filters generating for a set of subdomains, each constituting a respective sub-area of the layout being searched. If the bloom filter of a particular subdomain has bits set that match the bits set in the reference geometry's bloom filter, the subdomain may be considered a "subdomain of interest" in that the potential remains for the reference geometry to be present within that subdomain based on the results of the comparison 1020. Further searching of other subdomains (whose bloom filters are not a match) may be skipped, with additional search stages (e.g., 1030) being performed exclusively on the subdomains of interest. If no subdomains of interest result from the bloom filter comparison 1020, the search may end, with search results being generated and returned 1035 (e.g., to the querying system) to indicate that no instances of the reference geometry are present in the subject chip layout. One or more additional search stages may include stages to further weed-out subdomains from subsequent search stages (e.g., based on identify conflicts in the corresponding bloom filter comparison), for instance, through hash-based searches or matching. An ultimate search stage may include an in-depth, Boolean analysis to determine (e.g., within a threshold degree of precision) whether any of the geometries of the subdomains of interest match the reference geometry. Results of these additional search stages may also be generated and returned 1035 to the user (e.g., of the querying system), among other example features and embodiments.

Turning to the example of FIG. 10B, search indexes for use in a search of a chip layout (such as discussed in the examples above, including the example of FIG. 10A) may be performed by receiving 1040 data describing or otherwise identifying at least a portion (e.g., a layer) of a chip layout. The chip layout may be analyzed by an index building system to sub-divide the overall chip layout into manageable subdomains (at 1045) and parsing the chip layout to detect various polygons present within the layout (at 1050). Hashes may be determined 1055 for the polygons. For instance, hashes may be determined for each of the pairs of polygons detected in each of the respective subdomains of the layout. Respective bloom filters may be generated 1060 for each one of the subdomains using the hashes. A search index for the chip layout may be constructed (at 1065) to identify the information, hashes, and bloom filters determined for the groupings of polygons and this information may be mapped or associated with specific subdomains of the layout, among other example implementations. The search index and associated data (e.g., subdomain bloom filters) may be stored in computer memory for access and use by a search engine in determining whether various reference geometries may be present within the subject chip layout, among other example features and implementations.

Figure 11:
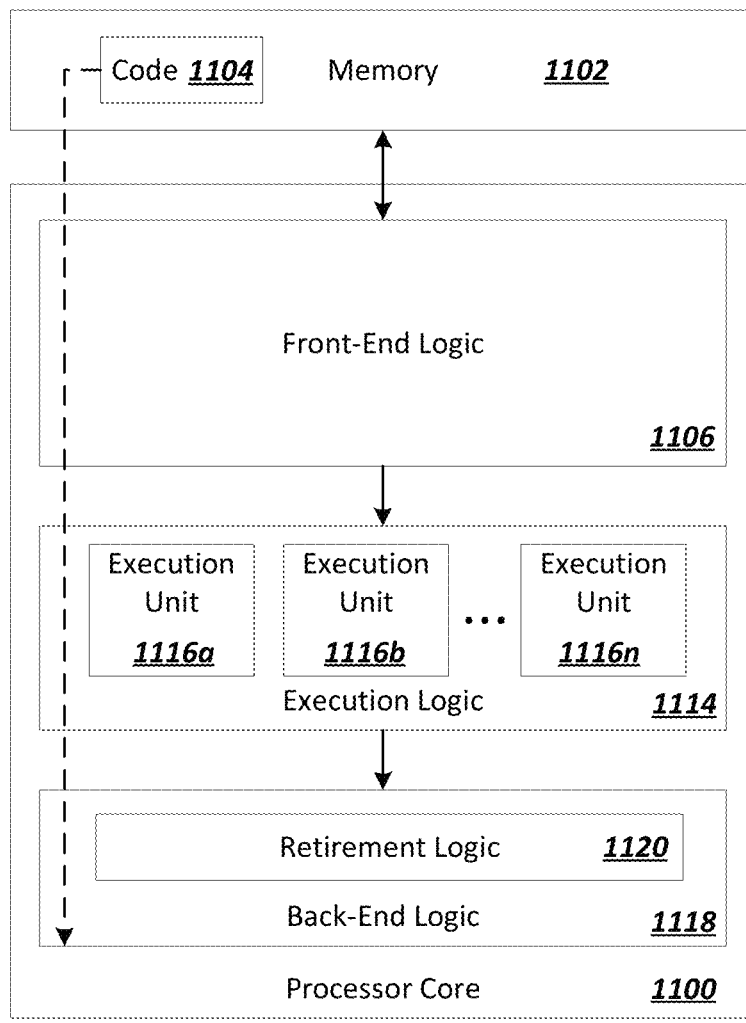
FIG. 11 is a block diagram of an exemplary processor in accordance with one embodiment.
Figure 12:
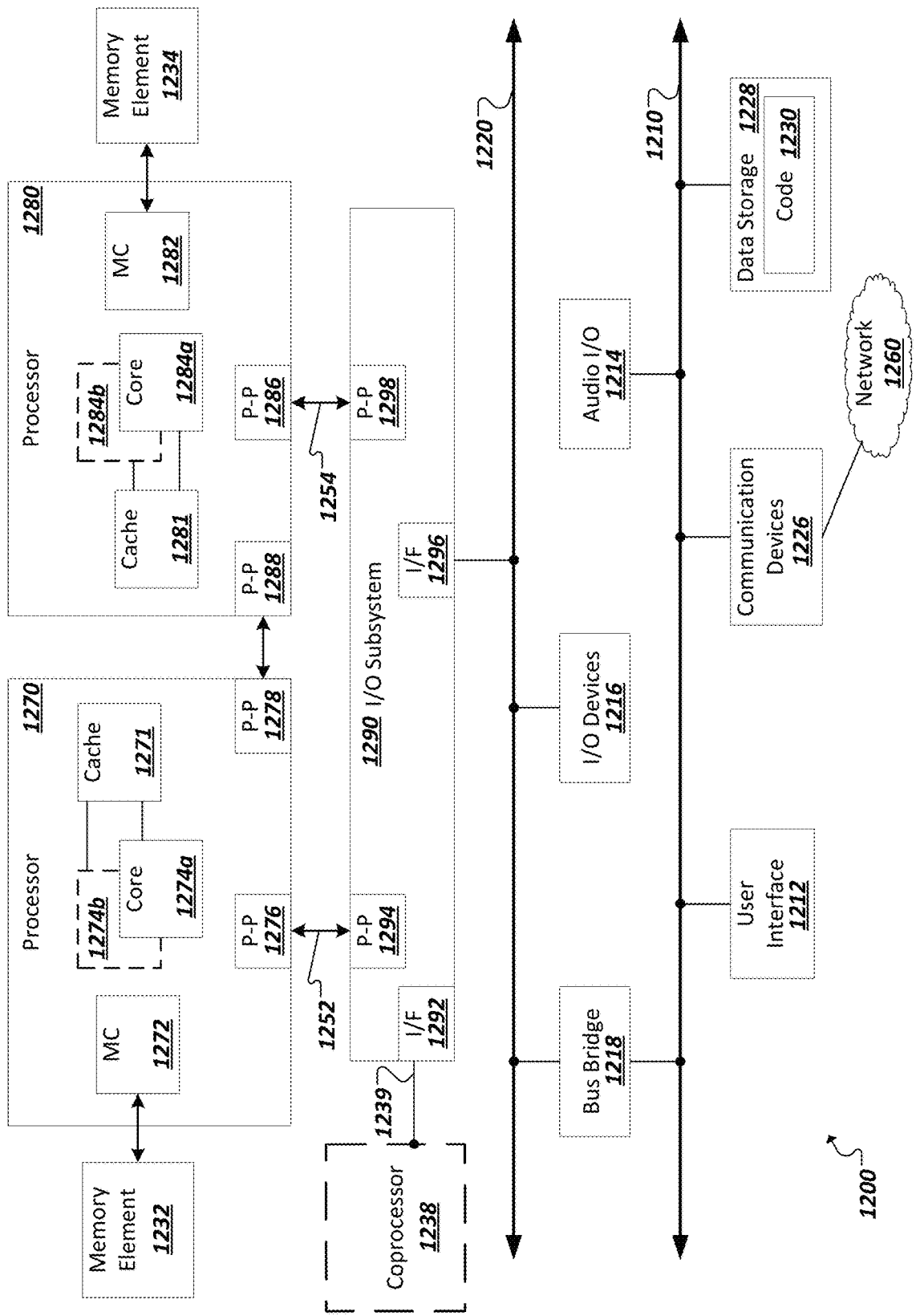
FIG. 12 is a block diagram of an exemplary computing system in accordance with one embodiment.

FIGS. 11-12 are block diagrams of exemplary computer architectures that may be used in accordance with embodiments disclosed herein. For instance, the computer architectures shown in these examples may be utilized to implement or execute an improved compiler and/or a portion of a target computing device. In other examples, the computer architectures shown in these examples may consume results generated by the neural network, provide data for use as inputs to the neural networks, among other cooperative uses. It should be appreciated that other computer architecture designs known in the art for processors and computing systems may also be used. Generally, suitable computer architectures for embodiments disclosed herein can include, but are not limited to, configurations illustrated in FIGS. 11-12.

FIG. 11 is an example illustration of a processor according to an embodiment. Processor 1100 is an example of a type of hardware device that can be used in connection with the implementations above. Processor 1100 may be any type of processor, such as a microprocessor, an embedded processor, a digital signal processor (DSP), a network processor, a multi-core processor, a single core processor, or other device to execute code. Although only one processor 1100 is illustrated in FIG. 11, a processing element may alternatively include more than one of processor 1100 illustrated in FIG. 11. Processor 1100 may be a single-threaded core or, for at least one embodiment, the processor 1100 may be multi-threaded in that it may include more than one hardware thread context (or "logical processor") per core.

FIG. 11 also illustrates a memory 1102 coupled to processor 1100 in accordance with an embodiment. Memory 1102 may be any of a wide variety of memories (including various layers of memory hierarchy) as are known or otherwise available to those of skill in the art. Such memory elements can include, but are not limited to, random access memory (RAM), read only memory (ROM), logic blocks of a field programmable gate array (FPGA), erasable programmable read only memory (EPROM), and electrically erasable programmable ROM (EEPROM).

Processor 1100 can execute any type of instructions associated with algorithms, processes, or operations detailed herein. Generally, processor 1100 can transform an element or an article (e.g., data) from one state or thing to another state or thing.

Code 1104, which may be one or more instructions to be executed by processor 1100, may be stored in memory 1102, or may be stored in software, hardware, firmware, or any suitable combination thereof, or in any other internal or external component, device, element, or object where appropriate and based on particular needs. In one example, processor 1100 can follow a program sequence of instructions indicated by code 1104. Each instruction enters a front-end logic 1106 and is processed by one or more decoders 1108. The decoder may generate, as its output, a micro operation such as a fixed width micro operation in a predefined format, or may generate other instructions, microinstructions, or control signals that reflect the original code instruction. Front-end logic 1106 also includes register renaming logic 1110 and scheduling logic 1112, which generally allocate resources and queue the operation corresponding to the instruction for execution.

Processor 1100 can also include execution logic 1114 having a set of execution units 1116a, 1116b, 1116n, etc. Some embodiments may include a number of execution units dedicated to specific functions or sets of functions. Other embodiments may include only one execution unit or one execution unit that can perform a particular function. Execution logic 1114 performs the operations specified by code instructions.

After completion of execution of the operations specified by the code instructions, back-end logic 1118 can retire the instructions of code 1104. In one embodiment, processor 1100 allows out of order execution but requires in order retirement of instructions. Retirement logic 1120 may take a variety of known forms (e.g., re-order buffers or the like). In this manner, processor 1100 is transformed during execution of code 1104, at least in terms of the output generated by the decoder, hardware registers and tables utilized by register renaming logic 1110, and any registers (not shown) modified by execution logic 1114.

Although not shown in FIG. 11, a processing element may include other elements on a chip with processor 1100. For example, a processing element may include memory control logic along with processor 1100. The processing element may include I/O control logic and/or may include I/O control logic integrated with memory control logic. The processing element may also include one or more caches. In some embodiments, non-volatile memory (such as flash memory or fuses) may also be included on the chip with processor 1100.

FIG. 12 illustrates a computing system 1200 that is arranged in a point-to-point (PtP) configuration according to an embodiment. In particular, FIG. 12 shows a system where processors, memory, and input/output devices are interconnected by a number of point-to-point interfaces.

Processors 1270 and 1280 may also each include integrated memory controller logic (MC) 1272 and 1282 to communicate with memory elements 1232 and 1234. Example processors (e.g., 2070, 2080) may include one or more processor cores (e.g., 1274a-b, 1248a-b), which may be coupled to respective cache memory (e.g., 1271, 1282). In alternative embodiments, memory controller logic 1272 and 1282 may be discrete logic separate from processors 1270 and 1280. Memory elements 1232 and/or 1234 may store various data to be used by processors 1270 and 1280 in achieving operations and functionality outlined herein.

Processors 1270 and 1280 may be any type of processor, such as those discussed in connection with other figures. Processors 1270 and 1280 may exchange data via a point-to-point (PtP) interface 1250 using point-to-point interface circuits 1278 and 1288, respectively. Processors 1270 and 1280 may each exchange data with a chipset 1290 via individual point-to-point interfaces 1252 and 1254 using point-to-point interface circuits 1276, 1286, 1294, and 1298. Chipset 1290 may also exchange data with a co-processor 1238, such as a high-performance graphics circuit, machine learning accelerator, or other co-processor 1238, via an interface 1239, which could be a PtP interface circuit. In alternative embodiments, any or all of the PtP links illustrated in FIG. 12 could be implemented as a multi-drop bus rather than a PtP link.

Chipset 1290 may be in communication with a bus 1220 via an interface circuit 1296. Bus 1220 may have one or more devices that communicate over it, such as a bus bridge 1218 and I/O devices 1216. Via a bus 1210, bus bridge 1218 may be in communication with other devices such as a user interface 1212 (such as a keyboard, mouse, touchscreen, or other input devices), communication devices 1226 (such as modems, network interface devices, or other types of communication devices that may communicate through a computer network 1260), audio I/O devices 1214, and/or a data storage device 1228. Data storage device 1228 may store code 1230, which may be executed by processors 1270 and/or 1280. In alternative embodiments, any portions of the bus architectures could be implemented with one or more PtP links.

The computer system depicted in FIG. 12 is a schematic illustration of an embodiment of a computing system that may be utilized to implement various embodiments discussed herein. It will be appreciated that various components of the system depicted in FIG. 12 may be combined in a system-on-a-chip (SoC) architecture or in any other suitable configuration capable of achieving the functionality and features of examples and implementations provided herein.

While some of the systems and solutions described and illustrated herein have been described as containing or being associated with a plurality of elements, not all elements explicitly illustrated or described may be utilized in each alternative implementation of the present disclosure. Additionally, one or more of the elements described herein may be located external to a system, while in other instances, certain elements may be included within or as a portion of one or more of the other described elements, as well as other elements not described in the illustrated implementation. Further, certain elements may be combined with other components, as well as used for alternative or additional purposes in addition to those purposes described herein.

Further, it should be appreciated that the examples presented above are non-limiting examples provided merely for purposes of illustrating certain principles and features and not necessarily limiting or constraining the potential embodiments of the concepts described herein. For instance, a variety of different embodiments can be realized utilizing various combinations of the features and components described herein, including combinations realized through the various implementations of components described herein. Other implementations, features, and details should be appreciated from the contents of this Specification.

Although this disclosure has been described in terms of certain implementations and generally associated methods, alterations and permutations of these implementations and methods will be apparent to those skilled in the art. For example, the actions described herein can be performed in a different order than as described and still achieve the desirable results. As one example, the processes depicted in the accompanying figures do not necessarily require the particular order shown, or sequential order, to achieve the desired results. In certain implementations, multitasking and parallel processing may be advantageous. Additionally, other user interface layouts and functionality can be supported. Other variations are within the scope of the following claims.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

The following examples pertain to embodiments in accordance with this Specification. Example 1 is a machine-readable storage medium with instructions stored thereon, where the instructions are executable by a machine to cause the machine to: receive data describing a particular reference geometry; generate a hash based on the particular reference geometry; generate a reference bloom filter for the particular reference geometry based on the hash; and perform a search to determine whether instances of the reference geometry are present in a particular integrated circuit (IC) layout, where the area of the particular IC layout is subdivided into a plurality of subdomains, and each of the plurality of subdomains corresponds to a respective subarea of the particular IC layout, where performing the search includes: accessing a plurality of bloom filters, where each of the plurality of bloom filters corresponds to a respective one of the plurality of subdomains; comparing the reference bloom filter with each one of the plurality of bloom filters to identify one or more subdomains of interest within the plurality of subdomains; searching the one or more subdomains of interest to determine whether the particular reference geometry is present in at least one of the subdomains of interest; and generating a search result based searching the one or more subdomains of interest.

Example 2 includes the subject matter of example 1, where the hash includes a reference hash, and searching the one or more subdomains of interest includes performing a search of the subdomains of interest to detect hashes in the subdomains of interest matching the reference hash.

Example 3 includes the subject matter of any one of examples 1-2, where the reference geometry includes geometry of an element identified as potentially impacting yield of a particular integrated circuit to be manufactured based on the particular IC layout.

Example 4 includes the subject matter of any one of examples 1-3, where the reference geometry includes a plurality of polygons, and the instructions are further executable to cause the machine to determine a set of polygon pairs in the plurality of polygons; where the hash includes a set of polygon pair hashes, the set of polygon pair hashes includes respective hashes for each one of the set of polygon pairs, and generating each of the set of polygon pair hashes includes performing a particular hash function on respective data describing attributes of the corresponding polygon pair.

Example 5 includes the subject matter of example 4, where generating the hash further includes generating polygon hashes for each one of the set of polygons, and the attributes includes a relative distance between polygons in the polygon pair and the respective polygon hashes of the polygons in the polygon pair.

Example 6 includes the subject matter of example 5, where each of the polygon hashes are generated based at least in part on lengths of sides of the respective polygon.

Example 7 includes the subject matter of example 6, where each of the polygon hashes are generated based further in part on relative angles of the sides of the polygon.

Example 8 includes the subject matter of any one of examples 4-7, where the reference bloom filter is populated based on values of the set of polygon pair hashes.

Example 9 includes the subject matter of any one of examples 1-8, where the data includes a search query, the search query identifies the particular reference geometry and further identifies the particular IC layout, and the instructions are further executable to cause the machine to select a particular search data structure from a plurality of search data structure based on identification of the particular IC layout in the query, where the particular search data structure includes an index describing the particular IC layout.

Example 10 includes the subject matter of any one of examples 1-9, where the instructions are further executable to cause the machine to convert the data describing the particular reference geometry into a set of values according to an encoding scheme, where the hash is generated for the particular reference geometry from the set of values.

Example 11 is a method including: receiving data describing a particular reference geometry; generating a hash based on the particular reference geometry; generating a reference bloom filter for the particular reference geometry based on the hash; and performing a search to determine whether instances of the reference geometry are present in a particular integrated circuit (IC) layout, where the area of the particular IC layout is subdivided into a plurality of subdomains, and each of the plurality of subdomains corresponds to a respective subarea of the particular IC layout, where performing the search includes: accessing a plurality of bloom filters, where each of the plurality of bloom filters corresponds to a respective one of the plurality of subdomains; comparing the reference bloom filter with each one of the plurality of bloom filters to identify one or more subdomains of interest within the plurality of subdomains; searching the one or more subdomains of interest to determine whether the particular reference geometry is present in at least one of the subdomains of interest; and generating a search result based searching the one or more subdomains of interest.

Example 12 includes the subject matter of example 11, where the method is performed by a search engine.

Example 13 includes the subject matter of any one of examples 11-12, where the hash includes a reference hash, and searching the one or more subdomains of interest includes performing a search of the subdomains of interest to detect hashes in the subdomains of interest matching the reference hash.

Example 14 includes the subject matter of any one of examples 11-13, where the reference geometry includes geometry of an element identified as potentially impacting yield of a particular integrated circuit to be manufactured based on the particular IC layout.

Example 15 includes the subject matter of any one of examples 11-14, where the reference geometry includes a plurality of polygons, and the method further includes determining a set of polygon pairs in the plurality of polygons; where the hash includes a set of polygon pair hashes, the set of polygon pair hashes includes respective hashes for each one of the set of polygon pairs, and generating each of the set of polygon pair hashes includes performing a particular hash function on respective data describing attributes of the corresponding polygon pair.

Example 16 includes the subject matter of example 15, where generating the hash further includes generating polygon hashes for each one of the set of polygons, and the attributes includes a relative distance between polygons in the polygon pair and the respective polygon hashes of the polygons in the polygon pair.

Example 17 includes the subject matter of example 16, where each of the polygon hashes are generated based at least in part on lengths of sides of the respective polygon.

Example 18 includes the subject matter of example 17, where each of the polygon hashes are generated based further in part on relative angles of the sides of the polygon.

Example 19 includes the subject matter of any one of examples 15-18, where the reference bloom filter is populated based on values of the set of polygon pair hashes.

Example 20 includes the subject matter of any one of examples 11-19, where the data includes a search query, the search query identifies the particular reference geometry and further identifies the particular IC layout, and the method further includes selecting a particular search data structure from a plurality of search data structure based on identification of the particular IC layout in the query, where the particular search data structure includes an index describing the particular IC layout.

Example 21 is a system including means to perform the method of any one of examples 11-19.

Example 22 includes the subject matter of example 21, where the means include a search engine.

Example 23 is a machine-readable storage medium with instructions stored thereon, where the instructions are executable by a machine to cause the machine to: receive data describing an integrated circuit (IC) layout; determine a set of subdomains of the IC layout, where each subdomain in the set of subdomains corresponds to a respective subarea of the IC layout; determine, for each subdomain in the set of subdomains, a respective set of polygons present in the corresponding subarea; determine a set of hashes for each one of the subdomains based on the respective set of polygons in the subdomain; generate a bloom filter for each one of the subdomains based on the set of hashes determined for the subdomain; and generate a search data structure for the IC layout, where the data structure includes the bloom filters generated for the set of subdomains.

Example 24 includes the subject matter of example 23, where the instructions are further executable to cause the machine to determine, for each of the set of subdomains, polygon pairs in the set of polygons of the subdomain, where the set of hashes includes a respective polygon pair hash for each one of the determined polygon pairs in the corresponding set of polygons.

Example 25 includes the subject matter of example 24, where the instructions are further executable to cause the machine to determine polygon hashes for each distinct polygon in the IC layout.

Example 26 includes the subject matter of example 25, where determining the polygon pair hash for each polygon pair includes performing a particular hash function on respective data describing attributes of the corresponding polygon pair.

Example 27 includes the subject matter of any one of examples 23-26, where the search data structure includes a graph database.

Example 28 includes the subject matter of any one of examples 23-27, where the search data structure is configured for use by a search engine to determine whether instances of reference geometries are present in the IC layout.

Example 29 is a method including: receiving data describing an integrated circuit (IC) layout; determining a set of subdomains of the IC layout, where each subdomain in the set of subdomains corresponds to a respective subarea of the IC layout; determining, for each subdomain in the set of subdomains, a respective set of polygons present in the corresponding subarea; determining a set of hashes for each one of the subdomains based on the respective set of polygons in the subdomain; generating a bloom filter for each one of the subdomains based on the set of hashes determined for the subdomain; and generating a search data structure for the IC layout, where the data structure includes the bloom filters generated for the set of subdomains.

Example 30 includes the subject matter of example 29, further including, for each of the set of subdomains, determining polygon pairs in the set of polygons of the subdomain, where the set of hashes includes a respective polygon pair hash for each one of the determined polygon pairs in the corresponding set of polygons.

Example 31 includes the subject matter of example 30, further including determining polygon hashes for each distinct polygon in the IC layout.

Example 32 includes the subject matter of example 31, where determining the polygon pair hash for each polygon pair includes performing a particular hash function on respective data describing attributes of the corresponding polygon pair.

Example 33 includes the subject matter of any one of examples 29-32, where the search data structure includes a graph database.

Example 34 includes the subject matter of any one of examples 29-33, where the search data structure is configured for use by a search engine to determine whether instances of reference geometries are present in the IC layout.

Example 35 is a system including means to perform the method of any one of examples 29-33.

Example 36 is a system including: a data processor; a memory; and a search engine, executable by the data processor to: receive data describing a particular reference geometry; generate a hash based on the particular reference geometry; generate a reference bloom filter for the particular reference geometry based on the hash; and perform a search to determine whether instances of the reference geometry are present in a particular integrated circuit (IC) layout, where the area of the particular IC layout is subdivided into a plurality of subdomains, and each of the plurality of subdomains corresponds to a respective subarea of the particular IC layout, where performing the search includes: accessing a plurality of bloom filters, where each of the plurality of bloom filters corresponds to a respective one of the plurality of subdomains; comparing the reference bloom filter with each one of the plurality of bloom filters to identify one or more subdomains of interest within the plurality of subdomains; searching the one or more subdomains of interest to determine whether the particular reference geometry is present in at least one of the subdomains of interest; and generating a search result based searching the one or more subdomains of interest.

Example 37 includes the subject matter of example 36, further including an index engine, executable by the data processor to: receive layout data describing the particular IC layout; determine the plurality of subdomains of the IC layout; determine, for each subdomain in the plurality of subdomains, a respective set of polygons present in the corresponding subarea; determine a set of hashes for each one of the subdomains based on the respective set of polygons in the subdomain; generate the plurality of bloom filters for the plurality of subdomains based on the corresponding sets of hashes determined for the plurality of subdomains; and generate a search data structure for the particular IC layout, where the search data structure includes the plurality of bloom filters, where the search engine is to access the search data structure to perform the search.

Example 38 includes the subject matter of example 37, where the search data structure includes a graph data structure.

Example 39 includes the subject matter of any one of examples 37-38, where the index engine is to determine, for each of the plurality of subdomains, polygon pairs in the set of polygons of the subdomain, where the set of hashes includes a respective polygon pair hash for each one of the determined polygon pairs in the corresponding set of polygons.

Example 40 includes the subject matter of example 39, where the index engine is to cause the machine to determine polygon hashes for each distinct polygon in the IC layout.

Example 41 includes the subject matter of example 40, where determining the polygon pair hash for each polygon pair includes performing a particular hash function on respective data describing attributes of the corresponding polygon pair.

Example 42 includes the subject matter of any one of examples 36-41, where comparing the reference bloom filter with each one of the plurality of bloom filters includes performing comparisons of the reference bloom filter with multiple ones of the plurality of bloom filters in parallel.

Example 43 includes the subject matter of any one of examples 36-42, where the hash includes a reference hash, and searching the one or more subdomains of interest includes performing a search of the subdomains of interest to detect hashes in the subdomains of interest matching the reference hash.

Example 44 includes the subject matter of any one of examples 36-43, where the reference geometry includes geometry of an element identified as potentially impacting yield of a particular integrated circuit to be manufactured based on the particular IC layout.

Example 45 includes the subject matter of any one of examples 36-44, where the reference geometry includes a plurality of polygons, and the search engine is to determine a set of polygon pairs in the plurality of polygons; where the hash includes a set of polygon pair hashes, the set of polygon pair hashes includes respective hashes for each one of the set of polygon pairs, and generating each of the set of polygon pair hashes includes performing a particular hash function on respective data describing attributes of the corresponding polygon pair.

Example 46 includes the subject matter of example 45, where generating the hash further includes generating polygon hashes for each one of the set of polygons, and the attributes includes a relative distance between polygons in the polygon pair and the respective polygon hashes of the polygons in the polygon pair.

Example 47 includes the subject matter of example 46, where each of the polygon hashes are generated based at least in part on lengths of sides of the respective polygon.

Example 48 includes the subject matter of example 47, where each of the polygon hashes are generated based further in part on relative angles of the sides of the polygon.

Example 49 includes the subject matter of any one of examples 45-48, where the reference bloom filter is populated based on values of the set of polygon pair hashes.

Example 50 includes the subject matter of any one of examples 36-49, where the data includes a search query, the search query identifies the particular reference geometry and further identifies the particular IC layout, and the search engine is further to cause the machine to select a particular search data structure from a plurality of search data structure based on identification of the particular IC layout in the query, where the particular search data structure includes an index describing the particular IC layout.

Example 51 includes the subject matter of any one of examples 36-50, where the search engine is further to convert the data describing the particular reference geometry into a set of values according to an encoding scheme, where the hash is generated for the particular reference geometry from the set of values.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results.

What is claimed is:

1. At least one machine-readable storage medium with instructions stored thereon, wherein the instructions are executable by a machine to cause the machine to:
   receive data describing a particular reference geometry;
   generate a hash based on the particular reference geometry;
   generate a reference bloom filter for the particular reference geometry based on the hash; and perform a search to determine whether instances of the reference geometry are present in a particular integrated circuit (IC) layout, wherein the area of the particular IC layout is subdivided into a plurality of subdomains, and each of the plurality of subdomains corresponds to a respective subarea of the particular IC layout, wherein performing the search comprises:
accessing a plurality of bloom filters, wherein each of the plurality of bloom filters corresponds to a respective one of the plurality of subdomains;
comparing the reference bloom filter with each one of the plurality of bloom filters to identify one or more subdomains of interest within the plurality of subdomains;
searching the identified one or more subdomains of interest to determine whether the particular reference geometry is present in at least one of the subdomains of interest; and
generating a search result based searching the one or more subdomains of interest.

2. The storage medium of claim 1, wherein the hash comprises a reference hash, and searching the one or more subdomains of interest comprises performing a search of the subdomains of interest to detect hashes in the subdomains of interest matching the reference hash.

3. The storage medium of claim 1, wherein the reference geometry comprises geometry of an element identified as potentially impacting yield of a particular integrated circuit to be manufactured based on the particular IC layout.

4. The storage medium of claim 1, wherein the reference geometry comprises a plurality of polygons, and the instructions are further executable to cause the machine to determine a set of polygon pairs in the plurality of polygons;
wherein the hash comprises a set of polygon pair hashes, the set of polygon pair hashes comprises respective hashes for each one of the set of polygon pairs, and generating each of the set of polygon pair hashes comprises performing a particular hash function on respective data describing attributes of the corresponding polygon pair.

5. The storage medium of claim 4, wherein generating the hash further comprises generating polygon hashes for each one of the set of polygons, and the attributes comprises a relative distance between polygons in the polygon pair and the respective polygon hashes of the polygons in the polygon pair.

6. The storage medium of claim 5, wherein each of the polygon hashes are generated based at least in part on lengths of sides of the respective polygon.

7. The storage medium of claim 6, wherein each of the polygon hashes are generated based further in part on relative angles of the sides of the polygon.

8. The storage medium of claim 4, wherein the reference bloom filter is populated based on values of the set of polygon pair hashes.

9. The storage medium of claim 1, wherein the data comprises a search query, the search query identifies the particular reference geometry and further identifies the particular IC layout, and the instructions are further executable to cause the machine to select a particular search data structure from a plurality of search data structure based on identification of the particular IC layout in the query, wherein the particular search data structure comprises an index describing the particular IC layout.

10. The storage medium of claim 1, wherein the instructions are further executable to cause the machine to convert the data describing the particular reference geometry into a set of values according to an encoding scheme, wherein the hash is generated for the particular reference geometry from the set of values.

11. At least one machine-readable storage medium with instructions stored thereon, wherein the instructions are executable by a machine to cause the machine to:
receive data describing an integrated circuit (IC) layout;
determine a set of subdomains of the IC layout, wherein each subdomain in the set of subdomains corresponds to a respective subarea of the IC layout;
determine, for each subdomain in the set of subdomains, a respective set of polygons present in the corresponding subarea;
determine a set of hashes for each one of the subdomains based on the respective set of polygons in the subdomain;
generate a bloom filter for each one of the subdomains based on the set of hashes determined for the subdomain; and
generate a search data structure for the IC layout, wherein the data structure comprises the bloom filters generated for the set of subdomains.

12. The storage medium of claim 11, wherein the instructions are further executable to cause the machine to determine, for each of the set of subdomains, polygon pairs in the set of polygons of the subdomain, wherein the set of hashes comprises a respective polygon pair hash for each one of the determined polygon pairs in the corresponding set of polygons.

13. The storage medium of claim 12, wherein the instructions are further executable to cause the machine to determine polygon hashes for each distinct polygon in the IC layout.

14. The storage medium of claim 13, wherein determining the polygon pair hash for each polygon pair comprises performing a particular hash function on respective data describing attributes of the corresponding polygon pair.

15. The storage medium of claim 11, wherein the search data structure comprises a graph database.

16. The storage medium of claim 11, wherein the search data structure is configured for use by a search engine to determine whether instances of reference geometries are present in the IC layout.

17. A system comprising:
a data processor;
a memory; and
a search engine, executable by the data processor to:
receive data describing a particular reference geometry;
generate a hash based on the particular reference geometry;
generate a reference bloom filter for the particular reference geometry based on the hash; and
perform a search to determine whether instances of the reference geometry are present in a particular integrated circuit (IC) layout, wherein the area of the particular IC layout is subdivided into a plurality of subdomains, and each of the plurality of subdomains corresponds to a respective subarea of the particular IC layout, wherein performing the search comprises:
accessing a plurality of bloom filters, wherein each of the plurality of bloom filters corresponds to a respective one of the plurality of subdomains;
comparing the reference bloom filter with each one of the plurality of bloom filters to identify one or more subdomains of interest within the plurality of subdomains;

searching the identified one or more subdomains of interest to determine whether the particular reference geometry is present in at least one of the subdomains of interest; and generating a search result based searching the one or more subdomains of interest.

18. The system of claim 17, further comprising an index engine, executable by the data processor to:

receive layout data describing the particular IC layout;

determine the plurality of subdomains of the IC layout;

determine, for each subdomain in the plurality of subdomains, a respective set of polygons present in the corresponding subarea;

determine a set of hashes for each one of the subdomains based on the respective set of polygons in the subdomain;

generate the plurality of bloom filters for the plurality of subdomains based on the corresponding sets of hashes determined for the plurality of subdomains; and generate a search data structure for the particular IC layout, wherein the search data structure comprises the plurality of bloom filters, wherein the search engine is to access the search data structure to perform the search.

19. The system of claim 18, wherein the search data structure comprises a graph data structure.

20. The system of claim 17, wherein comparing the reference bloom filter with each one of the plurality of bloom filters comprises performing comparisons of the reference bloom filter with multiple ones of the plurality of bloom filters in parallel.

\* \* \* \* \*